US012666784B2

(12) United States Patent
Mei

(10) Patent No.: US 12,666,784 B2
(45) Date of Patent: Jun. 23, 2026

(54) QUANTUM DOT LIGHT-EMITTING DEVICE AND MANUFACTURING METHOD THEREOF

(71) Applicant: BOE Technology Group Co., Ltd., Beijing (CN)

(72) Inventor: Wenhai Mei, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 1084 days.

(21) Appl. No.: 17/638,730

(22) PCT Filed: Jan. 27, 2021

(86) PCT No.: PCT/CN2021/074008

§ 371 (c)(1),
(2) Date: Feb. 25, 2022

(87) PCT Pub. No.: WO2022/160142

PCT Pub. Date: Aug. 4, 2022

(65) Prior Publication Data

US 2023/0165025 A1 May 25, 2023

(51) Int. Cl.

| | |
|---|---|
| ***G03F 7/004*** | (2006.01) |
| ***G03F 7/20*** | (2006.01) |
| ***H10K 50/115*** | (2023.01) |
| *B82Y 30/00* | (2011.01) |
| *B82Y 40/00* | (2011.01) |
| *H10K 102/00* | (2023.01) |

(52) U.S. Cl.

CPC ......... *H10K 50/115* (2023.02); *G03F 7/0045* (2013.01); *G03F 7/2016* (2013.01); *B82Y 30/00* (2013.01); *B82Y 40/00* (2013.01); *H10K 2102/351* (2023.02)

(58) Field of Classification Search

CPC ..... H10K 20/16; H10K 20/115; G03F 7/0045
See application file for complete search history.

(56) References Cited

U.S. PATENT DOCUMENTS

| | | | |
|---|---|---|---|
| 2016/0351842 | A1 | 12/2016 | Park et al. |
| 2021/0098726 | A1 | 4/2021 | Zhang |
| 2022/0140271 | A1 | 5/2022 | Li et al. |

FOREIGN PATENT DOCUMENTS

| | | | |
|---|---|---|---|
| CN | 110635057 | A | 12/2019 |
| CN | 111554820 | A | 8/2020 |
| CN | 111769200 | A | 10/2020 |
| CN | 112310330 | A | 2/2021 |

OTHER PUBLICATIONS

Kang, Hanlim et al., "Spatial Light Patterning of Full Color Quantum Dot Displays Enabled by Locally Controlled Surface Tailoring", Adv. Optical Mater., vol. 6, No. 9, Mar. 7, 2018, pp. 1701335-1701335.
International Search Report, mailed Oct. 18, 2021, from PCT/CN2021/074008 filed Jan. 27, 2021.

*Primary Examiner* — Daborah Chacko-Davis
(74) *Attorney, Agent, or Firm* — Workman Nydegger

(57) ABSTRACT

Disclosed are a quantum dot light-emitting device and a manufacturing method thereof, including: a substrate; a first electrode, disposed on the substrate; a carrier film layer, disposed on a side of the first electrode facing away from the substrate; a fixed layer, disposed on a side of the carrier film layer facing away from the substrate, a connecting structure being arranged between the fixed layer and the carrier film layer; a quantum dot layer, disposed on a side of the fixed layer facing away from the substrate; and a second electrode, disposed on a side of the quantum dot layer facing away from the substrate.

17 Claims, 11 Drawing Sheets

QUANTUM DOT LIGHT-EMITTING DEVICE AND MANUFACTURING METHOD THEREOF

CROSS REFERENCE TO RELATED APPLICATIONS

This application is a national phase entry under 35 U.S.C. § 371 of International Application No. PCT/CN2021/074008, filed on Jan. 27, 2021, the entire content of which is incorporated herein by reference.

FIELD

The disclosure relates to the technical field of display, in particular to a quantum dot light-emitting device and a manufacturing method thereof.

BACKGROUND

Quantum dots (QDs), also called semiconductor nanocrystalline or semiconductor nanoparticles, refer to nanometer solid materials whose sizes are all in a nanometer order of magnitude in three dimensions of space or materials that are formed by them as basic units. They are a collection of atoms and molecules on a nano scale. Light-emitting diodes based on quantum dot materials are called quantum dot light-emitting diodes (QLEDs), which are a new type of light-emitting devices.

SUMMARY

An embodiment of the disclosure provides a quantum dot light-emitting device, including:

- a substrate;
- a first electrode, disposed on the substrate;
- a carrier film layer, disposed on a side of the first electrode facing away from the substrate;
- a fixed layer, disposed on a side of the carrier film layer facing away from the substrate, wherein a connecting structure is arranged between the fixed layer and the carrier film layer;
- a quantum dot layer, disposed on a side of the fixed layer facing away from the substrate; and
- a second electrode, disposed on a side of the quantum dot layer facing away from the substrate.

Optionally, in the above quantum dot light-emitting device provided by embodiments of the disclosure, the connecting structure is one of the following:

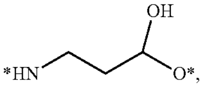
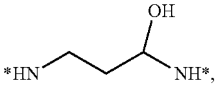
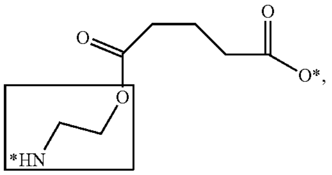
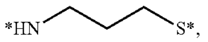
or

-continued

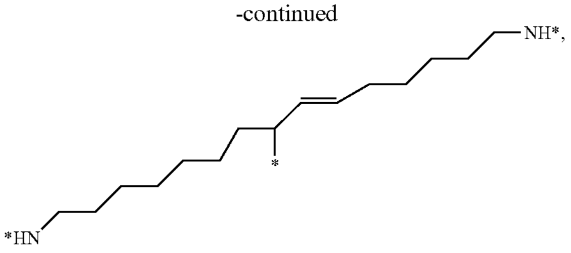

where a position indicated by * in NH* represents a position for connecting with the fixed layer, and a position indicated by other * represents a position for connecting with the carrier film layer.

Optionally, in the above quantum dot light-emitting device provided by embodiments of the disclosure, an orthographic projection of the fixed layer on the substrate completely overlaps with an orthographic projection of the quantum dot layer on the substrate.

Optionally, in the above quantum dot light-emitting device provided by embodiments of the disclosure, the connecting structure is formed by subjecting a first radical of the carrier film layer and a photosensitive radical connected with the fixed layer to a cross-link reaction under irradiation of ultraviolet light.

Optionally, in the above quantum dot light-emitting device provided by embodiments of the disclosure, an overall molecular structure of the fixed layer and the photosensitive radical includes:

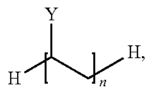

where n>1 and Y is any one of

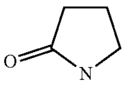
or
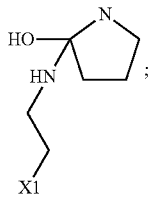
;

and the overall molecular structure of the fixed layer and the photosensitive radical at least includes one

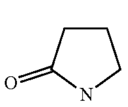
and one
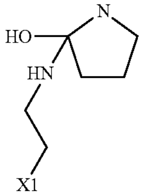
, where
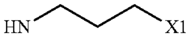

is the photosensitive radical.

Optionally, in the above quantum dot light-emitting device provided by embodiments of the disclosure, X1 is one of the following: an epoxy group, a hydroxyl group, an amino group, an acrylate radical, olefin, a mercapto group, or diene, and the first radical is one of the following: a hydroxyl group, an amino group, an epoxy group, an acrylate radical, a mercapto group, olefin, or diene.

Optionally, in the above quantum dot light-emitting device provided by embodiments of the disclosure, a molar ratio of

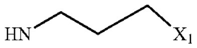 to

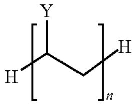

is smaller than or equal to 30%.

Optionally, in the above quantum dot light-emitting device provided by embodiments of the disclosure, a thickness of the fixed layer is smaller than or equal to 2 nm.

Optionally, in the above quantum dot light-emitting device provided by embodiments of the disclosure, the carrier film layer is an electron transport layer, and the quantum dot light-emitting device further includes: a hole transport layer disposed between the second electrode and the quantum dot layer, and a hole injection layer disposed between the hole transport layer and the second electrode.

Correspondingly, an embodiment of the disclosure further provides a manufacturing method of a quantum dot light-emitting device, including:

- forming a first electrode on a substrate;
- forming a carrier film layer on the first electrode;
- coating a sacrifice layer material on the carrier film layer;
- forming a mask layer with a through hole on the sacrifice layer material, the through hole corresponding to a target region, and using ultraviolet light to irradiate the target region, thereby subjecting the sacrifice layer material close to the carrier film layer in the target region and the carrier film layer to a cross-link reaction so as to form a fixed layer as well as a connecting structure connecting the carrier film layer and the fixed layer;
- removing the sacrifice layer material that does not undergo the cross-link reaction in the target region;
- coating a quantum dot material on the substrate where the fixed layer has been formed, and stripping the sacrifice layer material outside the target region, so as to form a patterned quantum dot layer in the target region; and
- forming a second electrode on the quantum dot layer material.

Optionally, in the manufacturing method of the above quantum dot light-emitting device provided by embodiments of the disclosure, the sacrifice layer material has a fixed unit and a photosensitive radical connected with the fixed unit, and the carrier film layer has a first radical.

The subjecting the sacrifice layer material close to the carrier film layer in the target region and the carrier film layer to the cross-link reaction so as to form the fixed layer as well as the connecting structure connecting the carrier film layer and the fixed layer includes:

- subjecting the photosensitive radical of the sacrifice layer material close to the carrier film layer in the target region and the first radical of the carrier film layer to the cross-link reaction to form the connecting structure, wherein the fixed unit connected with the radical subjected to the cross-link reaction constitutes the fixed layer.

Optionally, in the manufacturing method of the above quantum dot light-emitting device provided by embodiments of the disclosure, a structure of the sacrifice layer material includes

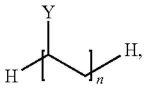

where n>1 and Y is any one of

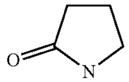 or 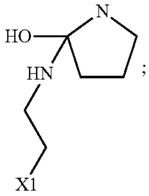 ;

and the structure of the sacrifice layer material at least includes one

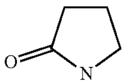 and one 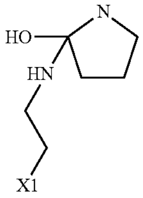 , where

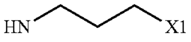

is the photosensitive radical.

Optionally, in the manufacturing method of the above quantum dot light-emitting device provided by embodiments of the disclosure, X1 is one of the following: an epoxy group, a hydroxyl group, an amino group, an acrylate radical, olefin, a mercapto group, or diene, and the first radical is one of the following: a hydroxyl group, an amino group, an epoxy group, an acrylate radical, a mercapto group, olefin, or diene.

Optionally, in the manufacturing method of the above quantum dot light-emitting device provided by embodiments of the disclosure, a molar ratio of

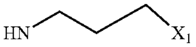 or

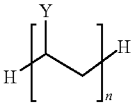

is smaller than or equal to 30%.

Optionally, in the manufacturing method of the above quantum dot light-emitting device provided by embodiments of the disclosure, the coating the sacrifice layer material on the carrier film layer includes: coating the sacrifice layer material with a photo acid generator on the carrier film layer.

The subjecting the photosensitive radical of the sacrifice layer material close to the carrier film layer in the target region and the first radical of the carrier film layer to the cross-link reaction to form the connecting structure includes: subjecting the photosensitive radical of the sacrifice layer material close to the carrier film layer in the target region and the first radical of the carrier film layer to the cross-link reaction under an action of hydrogen ions generated by the photo acid generator to form the connecting structure.

Optionally, in the manufacturing method of the above quantum dot light-emitting device provided by embodiments of the disclosure, the forming the carrier film layer on the first electrode is specifically: forming an electron transport layer on the first electrode.

After forming the quantum dot layer, and before forming the second electrode, the method further includes:

forming a hole transport layer on the quantum dot layer; and forming a hole injection layer on the hole transport layer.

Optionally, in the manufacturing method of the above quantum dot light-emitting device provided by embodiments of the disclosure, the forming the mask layer with the through hole on the sacrifice layer material specifically includes:

forming photoresist on the sacrifice layer material, patterning the photoresist, and removing the photoresist in a target region, so as to form the mask layer with the through hole.

Optionally, in the manufacturing method of the above quantum dot light-emitting device provided by embodiments of the disclosure, the performing composition on the photoresist and removing the photoresist in the target region specifically includes:

shading the photoresist by a mask, wherein the mask comprises a light transmitting region and a light shading region, the light shading region corresponds to a photoresist reserving region, and the light transmitting region corresponds to the target region; and removing the photoresist in the target region using a solvent.

DETAILED DESCRIPTION

Figure 1:
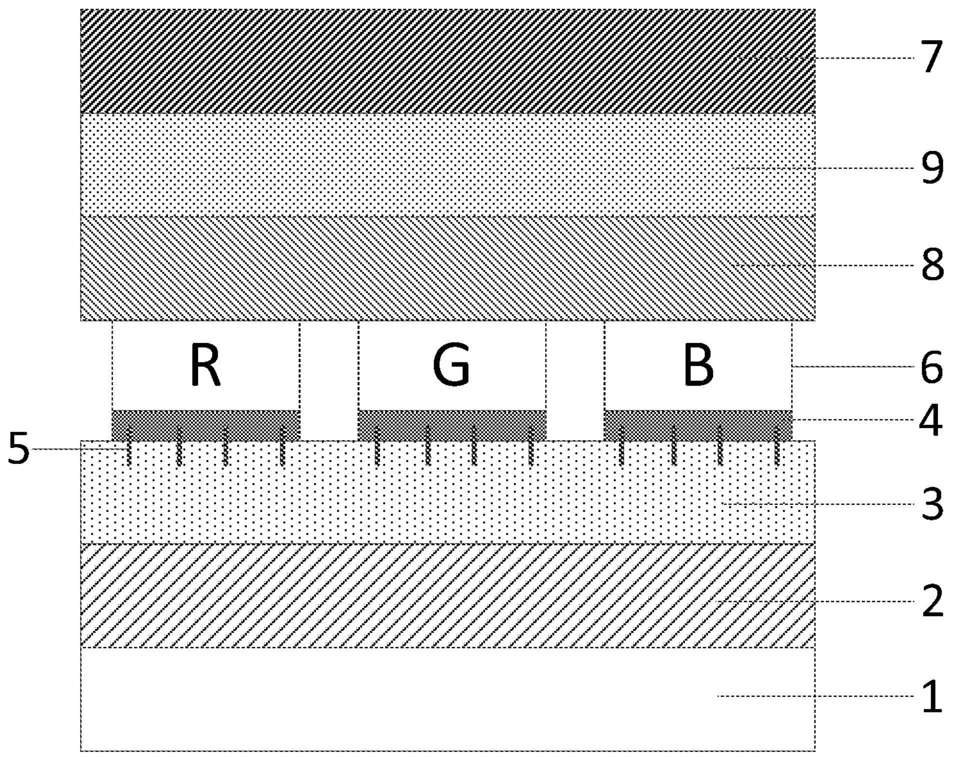
FIG. 1 is a schematic structural diagram of a quantum dot light-emitting device according to embodiments of the disclosure.

In order to make objectives, technical solutions and advantages of embodiments of the disclosure clearer, the technical solutions of the embodiments of the disclosure will be clearly and completely described below with reference to the accompanying drawings of the embodiments of the disclosure. Obviously, the described embodiments are some embodiments of the disclosure, rather than all the embodiments. Further, the embodiments of the disclosure and features of the embodiments may be combined with each other under a condition of no conflict. Based on the described embodiments of the disclosure, all other embodiments obtained by those of ordinary skill in the art without creative efforts fall within the protection scope of the disclosure.

Unless otherwise defined, technical or scientific terms used in the disclosure shall have the ordinary meaning as understood by those of ordinary skill in the art to which this disclosure belongs. Similar words such as “comprise” or “include” mean that elements or items appearing before the words encompass elements or items recited after the words and their equivalents, but do not exclude other elements or items. Words like “connected” or “linked” are not limited to physical or mechanical connections, but may include electrical connections, whether direct or indirect. “Inner”, “outer”, “upper”, “lower”, etc. are only used to indicate a relative positional relationship, and when an absolute position of a described object changes, the relative positional relationship may also change accordingly.

It should be noted that dimensions and shapes of figures in the accompanying drawings do not reflect a real scale, and are only intended to illustrate the disclosure. The same or similar reference numerals refer to the same or similar elements or elements having the same or similar functions throughout.

A colloidal solution of quantum dots may be patterned by means of printing, transfer printing, photoetching, etc., but printing equipment is expensive and has a limited resolution. In recent years, many researchers have done a lot of work in photoetching patterning. Some use direct photoetching to pattern a quantum dot film layer, that is, a method of cross-linking ligands. Under irradiation of ultraviolet light, the quantum dot ligands are cross-linked and cured, and a non-cross-linked part can be easily washed off by a solvent due to its high solubility. However, the method is prone to causing color mixing due to residue of the quantum dots when preparing full-color devices.

When patterning is carried out using a sacrifice layer, in unnecessary pixels, the quantum dots can be peeled off together with the sacrifice layer and photoresist, and it is not prone to color mixing. While in this method, etching of the sacrifice layer mainly uses dry etching by plasma. If the sacrifice layer needs to be subjected to wet-etching: in a previous wet etching process, for example, for inverted quantum dot devices, before patterned quantum dots are produced, a sacrifice layer and a photoresist layer may be prepared on an electron transport layer. There are usually hydroxyl groups on a surface of the electron transport layer. Commonly used sacrifice layer materials include polar groups, so that the polar groups at a bottom of the sacrifice layer and the hydroxyl groups on the surface of the electron transport layer have strong interactions, and in order to avoid lateral etching of the sacrifice layer under photoresist by an etching solution, wet etching must be controlled within a certain period of time. During this period of time, a part of the sacrifice layer that has a strong interaction with the hydroxyl groups on the surface of the electron transport layer cannot be dissolved in a solvent within set time, which eventually results in that the sacrifice layer cannot be cleanly and thoroughly etched and causes certain residue inside the pixels, thus leading to unevenness of sacrifice layer etching in the pixel. In this way, under a condition of the residue, when the quantum dots are spin-coated and then the sacrifice layer is peeled off, the residual sacrifice layer and the quantum dots above will be peeled off together, and deposition of patterned quantum dots cannot be realized.

In order to solve the above problem that due to unevenness of sacrifice layer etching, partial falling of a quantum dot layer is caused when a sacrifice layer is peeled off, so entirety of a film layer is reduced and a device fails to emit light evenly, embodiments of the disclosure provide a quantum dot light-emitting device, as shown in FIG. 1, including:

- a substrate 1;
- a first electrode 2, disposed on the substrate 1;
- a carrier film layer 3, disposed on a side of the first electrode 2 facing away from the substrate 1;
- a fixed layer 4, disposed on a side of the carrier film layer 3 facing away from the substrate 1, wherein a connecting structure 5 is provided between the fixed layer 4 and the carrier film layer 3;
- a quantum dot layer 6, disposed on a side of the fixed layer 4 facing away from the substrate 1; and
- a second electrode 7, disposed on a side of the quantum dot layer 6 facing away from the substrate 1.

It should be noted that, a scheme of a sacrifice layer material plus photoresist is adopted to manufacture a patterned quantum dot layer.

In the above quantum dot light-emitting device provided by embodiments of the disclosure, the fixed layer is arranged between the carrier film layer and the quantum dot layer, and the connecting structure is arranged between the fixed layer and the carrier film layer, that is, the fixed layer is fixed on the carrier film layer. In this way, during the quantum dot patterning using the sacrifice layer material plus the photoresist, ultraviolet light is used to irradiate a target region where quantum dots need to be deposited, the sacrifice layer material and a carrier film layer material in the target region are cross-linked, and the fixed layer is a film layer formed by subjecting thin film molecules close to the carrier film layer in the sacrifice layer material and the carrier film layer to a cross-link reaction, so that the fixed layer and the carrier film layer form chemical bonds and are tightly bonded together. Therefore, in a process of wet-etching the sacrifice layer material, a solvent only dissolves the sacrifice layer material not cross-linked with the carrier film layer in the target region, ultrasonic stripping is performed after the quantum dots are spin-coated, and the fixed layer below the quantum dots will not be peeled off using ultrasonic by the solvent because it is cross-linked with the carrier film layer, so that entirety of patterning the quantum dot layer is maintained.

During specific implementation, in the above quantum dot light-emitting device provided by embodiments of the disclosure, the connecting structure may be one of the following:

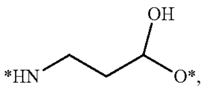
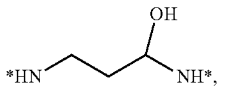
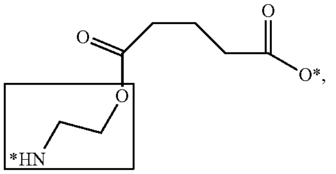
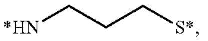
or
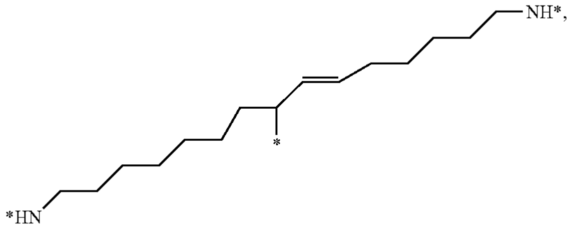

Here a position indicated by * in NH* represents a position for connecting with the fixed layer, and a position indicated other * represents a position for connecting with the carrier film layer.

As an example, when the connecting structure is

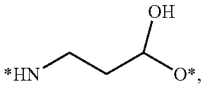

a structure of the sacrifice layer material is

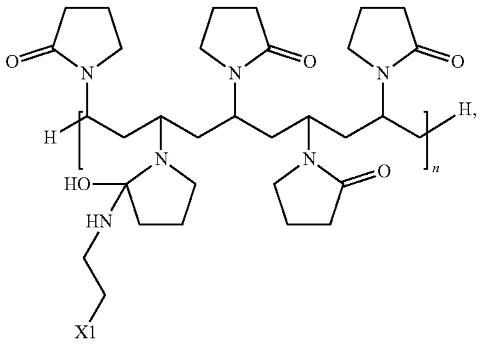

the carrier film layer has a hydroxyl group (OH), and an epoxy group of the sacrifice layer material undergoes a cross-link reaction with the hydroxyl group of the carrier film layer to form the connecting structure of

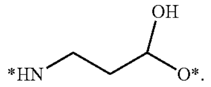

A manufacturing method of the sacrifice layer material and a method of patterning the quantum dot layer are introduced in detail below.

During specific implementation, in the above quantum dot light-emitting device provided by embodiments of the disclosure, as shown in FIG. 1, an orthographic projection of the fixed layer 4 on the substrate 1 completely overlaps with an orthographic projection of the quantum dot layer 6 on the substrate 1. In this way, in a process of patterning the quantum dot layer, the quantum dots will not be peeled off, so entirety of the quantum dot layer is ensured.

It should be noted that, where the orthographic projection of the fixed layer 4 on the substrate 1 completely overlaps with the orthographic projection of the quantum dot layer 6 on the substrate 1, a complete overlap is not absolute and a certain error range may exit. For example, a ratio of an area of the orthographic projection of the fixed layer 4 on the substrate 1 to an area of the orthographic projection of the quantum dot layer 6 on the substrate 1 is larger than 80%. No specific limitation is made.

Figure 2:
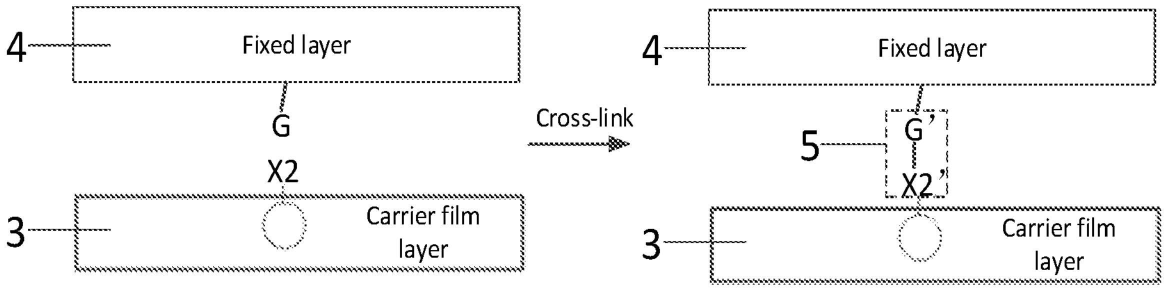
FIG. 2 is a schematic diagram showing film layers where a carrier film layer undergoes a cross-link reaction with material of a sacrifice layer according to embodiments of the disclosure.
Figure 5:
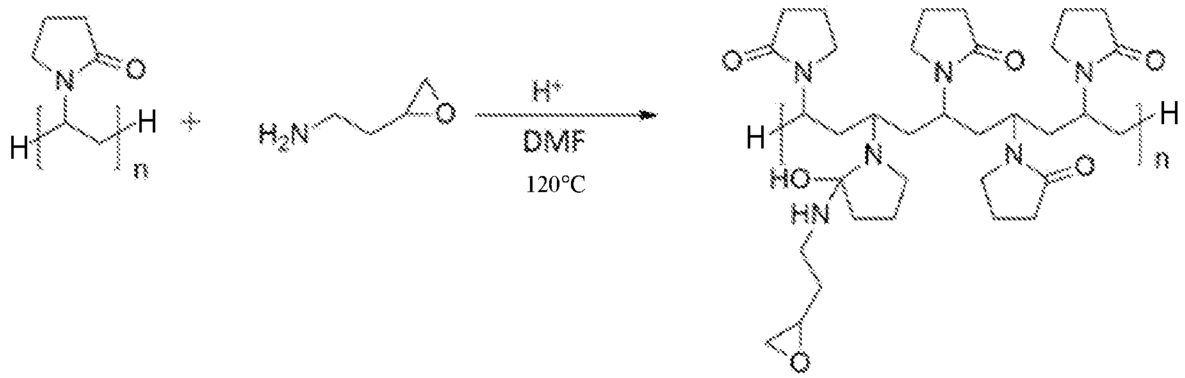
FIG. 5 is a schematic principle diagram of preparing material of a sacrifice layer according to embodiments of the disclosure.

During specific implementation, in the above quantum dot light-emitting device provided by embodiments of the disclosure, as shown in FIG. 2, which shows a structure before the connecting structure 5 is formed between the carrier film layer 3 and the fixed layer 4. The carrier film layer 3 has a first radical X2, the fixed layer 4 is connected with a photosensitive radical G, and the connecting structure 5 is formed by subjecting the first radical X2 and the photosensitive radical G to the cross-link reaction under irradiation of the ultraviolet light. FIG. 5 only illustrates one first radical X2 and one photosensitive radical G, which is for illustrative description and does not represent the true number of the first radical X2 and the photosensitive radical G.

It should be noted that, the fixed layer and a photosensitive radical connected therewith are integrally called the sacrifice layer material. Under irradiation of the ultraviolet light, the photosensitive radical of the thin layer sacrifice layer material close to the carrier film layer in the target region undergoes the cross-link reaction with the first radical on a surface of the carrier film layer, and a structure after reaction of the photosensitive radical and the first radical is the connecting structure; and the sacrifice layer material that does not undergo the cross-link reaction in the target region is etched, so that the fixed layer tightly connected with the carrier film layer is formed in the target region.

It should be noted that, in a process of forming the patterned quantum dot layer, a deposited sacrifice layer material is in contact with the carrier film layer by only one single-molecule layer, with a very thin thickness, and a current carrier transferred from the first electrode may pass the film layer (i.e. the fixed layer) through a tunneling effect, so no influence is caused on performance of the device.

During specific implementation, in the above quantum dot light-emitting device provided by embodiments of the disclosure, as shown in FIG. 1, a thickness of the fixed layer 4 is smaller than or equal to 2 nm.

Specifically, the sacrifice layer material and the carrier film layer material that may undergo the cross-link reaction under irradiation of the ultraviolet light are generalized as follows:

(1) the sacrifice layer material contains an epoxy group, and the carrier film layer material contains a hydroxyl group, an amino group, etc.; or the sacrifice layer material contains the hydroxyl group, the amino group, etc., and the carrier film layer material contains the epoxy group;

(2) the sacrifice layer material and the carrier film layer material both contain an acrylate radical;

(3) the sacrifice layer material contains olefin, and the carrier film layer material contains a mercapto group; or the sacrifice layer material contains the mercapto group, and the carrier film layer material contains the olefin; and (4) the sacrifice layer material contains the olefin, and the carrier film layer material contains diene; or the sacrifice layer material contains the diene, and the carrier film layer material contains the olefin.

A radical contained by the carrier film layer material in (1) to (4) above is the first radical, and a radical contained in the sacrifice layer material is a radical that can undergo the cross-link reaction with the first radical under irradiation of the ultraviolet light in the photosensitive radical.

Figure 3:
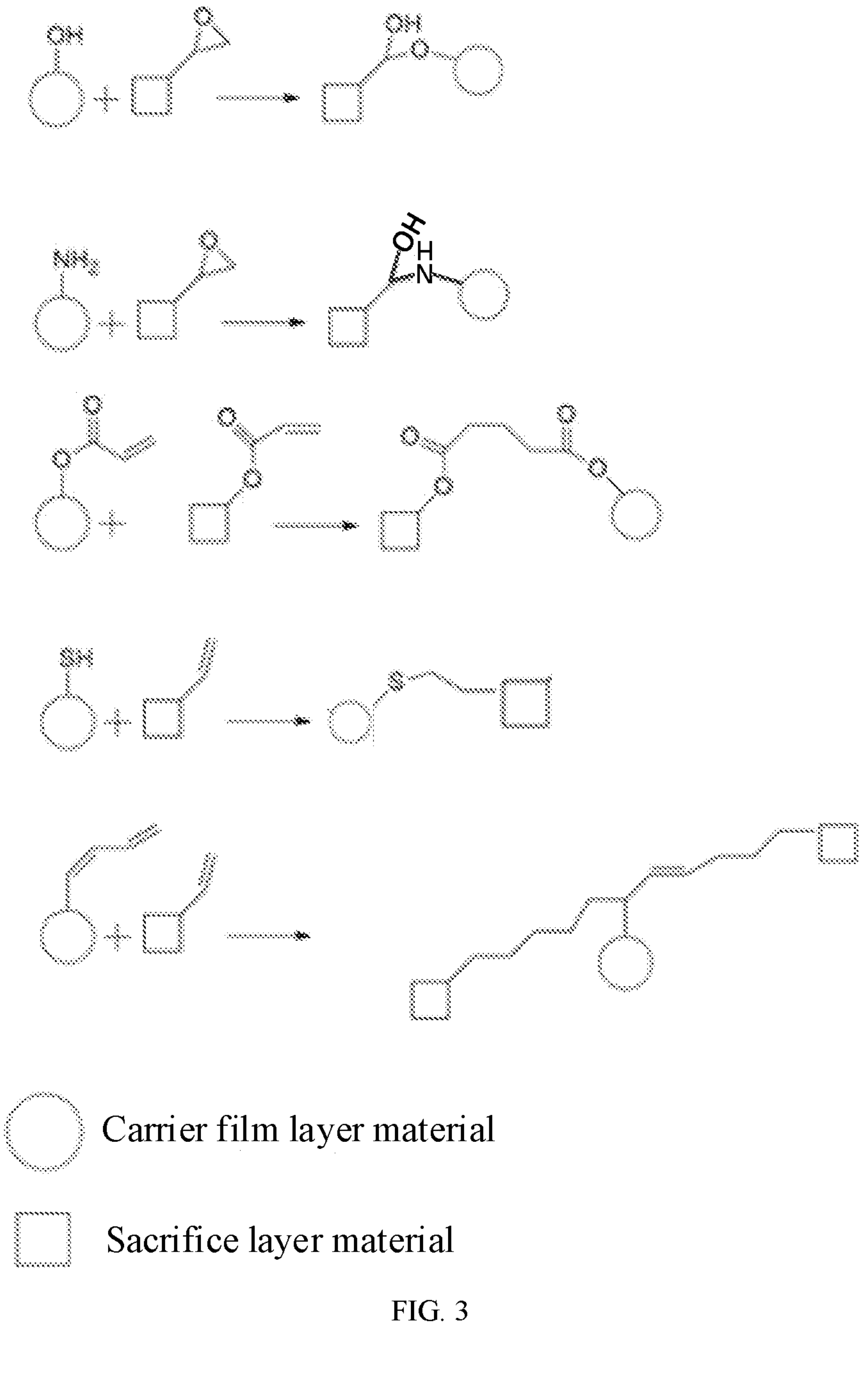
FIG. 3 is a schematic diagram showing a cross-link reaction between a carrier film layer and material of a sacrifice layer according to embodiments of the disclosure.

Exemplarily, a schematic diagram of the cross-link reaction between the first radical contained in the carrier film layer and the radical contained in the sacrifice layer material under irradiation of the ultraviolet light is shown in as FIG. 3, where the symbol ○ represents the carrier film layer, and the symbol □ represents the sacrifice layer material. FIG. 3 only discloses a part of illustrative description.

During specific implementation, in the above quantum dot light-emitting device provided by embodiments of the disclosure, an overall molecular structure of the fixed layer and the photosensitive radical includes:

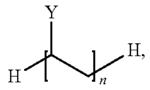

where n>1 and Y is any one of

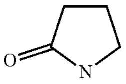 or 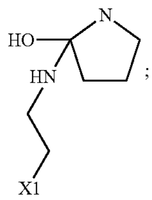 ;

and the overall molecular structure of the fixed layer and the photosensitive radical includes at least one

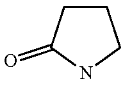 and one 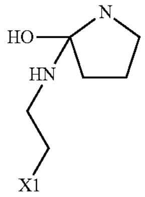 , where

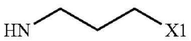

is the photosensitive radical.

In one possible embodiment, the structure of the sacrifice layer material is

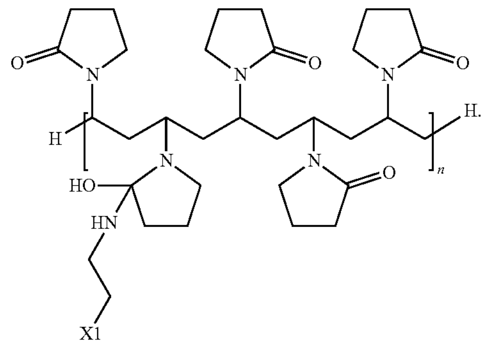

The structure

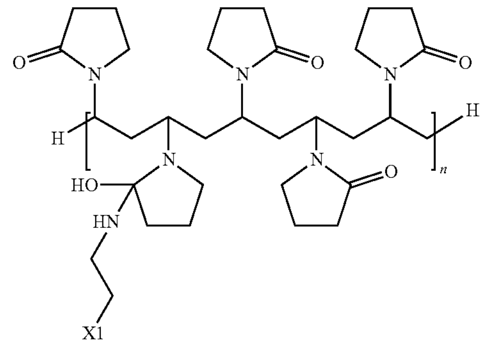

is illustrated by one monomer only including one

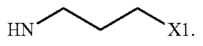

Because

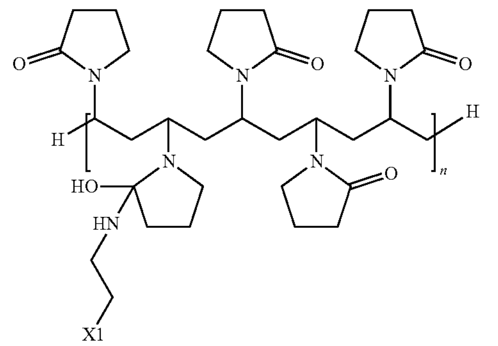

is a polymer, with a relatively large molecular weight, during practical manufacturing,

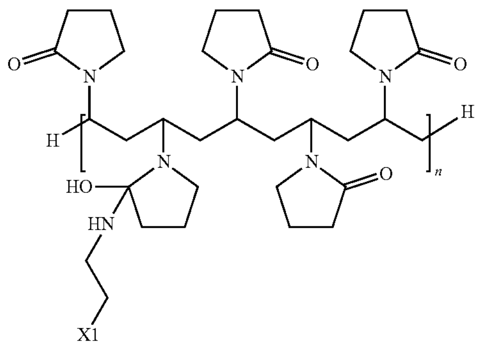

may also include a plurality of

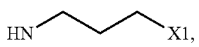

for example,

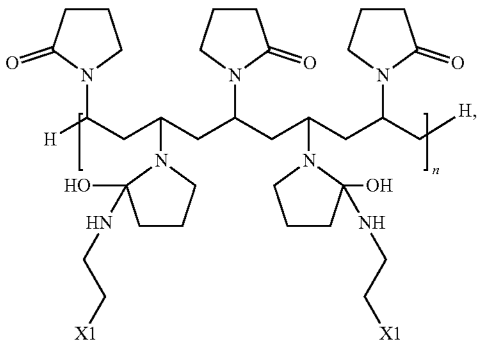

etc.

During specific implementation, in the above quantum dot light-emitting device provided by embodiments of the disclosure, X1 above may be one of the following: an epoxy group, a hydroxyl group, an amino group, an acrylate radical, olefin, a mercapto group, or diene, and the first radical connected with the surface of the carrier film layer may be one of the following: a hydroxyl group, an amino group, an epoxy group, an acrylate radical, a mercapto group, olefin, or diene. The X1 and the first radical are selected based on a situation that the cross-link reaction can be caused under irradiation of the ultraviolet light. Reference may be made to FIG. 3.

The fixed layer in the embodiment of the disclosure is a film layer formed by subjecting the photosensitive radical in the thin film molecules close to the carrier film layer in the sacrifice layer material and the first radical connected with the surface of the carrier film layer to the cross-link reaction under irradiation of the ultraviolet light, and the sacrifice layer material is formed by a copolymerization reaction between

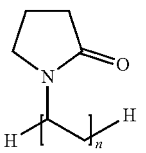

and a photosensitive radical

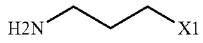

containing a radical that can undergo a photocrosslinking reaction. Considering a solubility of the sacrifice layer material that does not undergo the cross-link reaction in a solvent (in subsequent wet etching), a molar ratio of the photosensitive radical to the sacrifice layer material cannot be larger than 30%. If it is larger than 30%, the sacrifice layer material has a relatively low solubility in the solvent and is not easy to remove. Therefore, in the above quantum dot light-emitting device provided by embodiments of the disclosure, the molar ration of

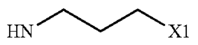

(the photosensitive radical) to

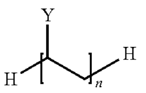

is smaller than or equal to 30%, so that in a subsequent process of stripping the sacrifice layer material that does not undergo the cross-link reaction, the solvent may rapidly dissolve the sacrifice layer material that does not undergo the cross-link reaction.

It should be noted that, the embodiment of the disclosure is described by taking the sacrifice layer material as an alcohol-soluble material as an example. Of course, the sacrifice layer material is not limited to the structure in the embodiment of the disclosure, and may also be of other structures, and the material soluble in the solvent and has the photosensitive radical belongs to contents under protection of the disclosure.

Currently, electroluminescent devices may be divided into a conventional structure and an inverted structure, and a difference between the conventional structure and the inverted structure lies in a manufacturing sequence of film layers. Specifically, the conventional structure refers to sequentially forming an anode, a hole injection layer, a hole transport layer, a quantum dot layer, an electron transport layer and a cathode in sequence on a substrate, and the inverted structure refers to sequentially forming an electron transport layer, a quantum dot layer, a hole transport layer, a hole injection layer and an anode on the substrate.

During specific implementation, in the above quantum dot light-emitting device provided by embodiments of the disclosure, as show in FIG. 1, to take the quantum dot light-emitting device of the inverted structure as an example, the carrier film layer 3 is an electron transport layer, and the quantum dot light-emitting device further includes: a hole transport layer 8 disposed between the second electrode 7 and the quantum dot layer 6, and a hole injection layer 9 disposed between the hole transport layer 8 and the second electrode 7.

Further, during specific implementation, in the above quantum dot light-emitting device provided by embodiments of the disclosure, a material of the electron transport layer includes ZnO, ZnMgO, or ZnAlOx. These electron transfer materials are characterized by having a great number of hydroxyl groups. These hydroxyl groups may undergo the cross-link reaction with the epoxy group, but when the radical contained by the photosensitive radical in the sacrifice layer material is not the epoxy group, for example, the radical contained by the sacrifice layer material is olefin, which cannot undergo the cross-link reaction with the hydroxyl groups, the hydroxyl groups on a surface of the electron transport layer need to be modified, for example, the hydroxyl groups are modified into mercapto groups, diene, etc.; and for example, the radical contained by the sacrifice layer material is an acrylate radical, which cannot undergo the cross-link reaction with the hydroxyl groups, the hydroxyl groups on a surface of the electron transport layer need to be modified, for example, the hydroxyl groups are modified into acrylate radicals. Enumeration is not made here.

It should be noted that, FIG. 1 of the embodiment of the disclosure is described by taking a device of the inverted structure as an example. When the conventional structure is used, the carrier film layer may be the hole transport layer. When a proper hole transport layer material is selected and a radical contained by the hole transport layer material can undergo the cross-link reaction with the radical in the sacrifice layer material, the material should belong to contents under protection of the disclosure.

It should be noted that, a light-emitting principle of the electroluminescent devices is: holes in the anode and electrons in the cathode are transferred to the quantum dot layer for recombination to emit light. Because of a difference in energy level barriers between the anode and a light-emitting layer and between the cathode and the light-emitting layer, the electrons and the holes are difficult to transfer and are different in transfer speeds and quantities. Therefore, in order to balance concentrations of the electrons and the holes, the hole injection layer and the hole transport layer are generally disposed between the quantum dot layer and the anode, and the hole transport layer are disposed between the quantum dot layer and the cathode. Of course, during specific implementation, the layers needed may be selected according to actual needs.

Specifically, the substrate provided by embodiments of the disclosure may include a base substrate, a driving circuit disposed on the base substrate, and a passivation layer, a planarization layer and other structures located above the driving circuit.

Figure 4:
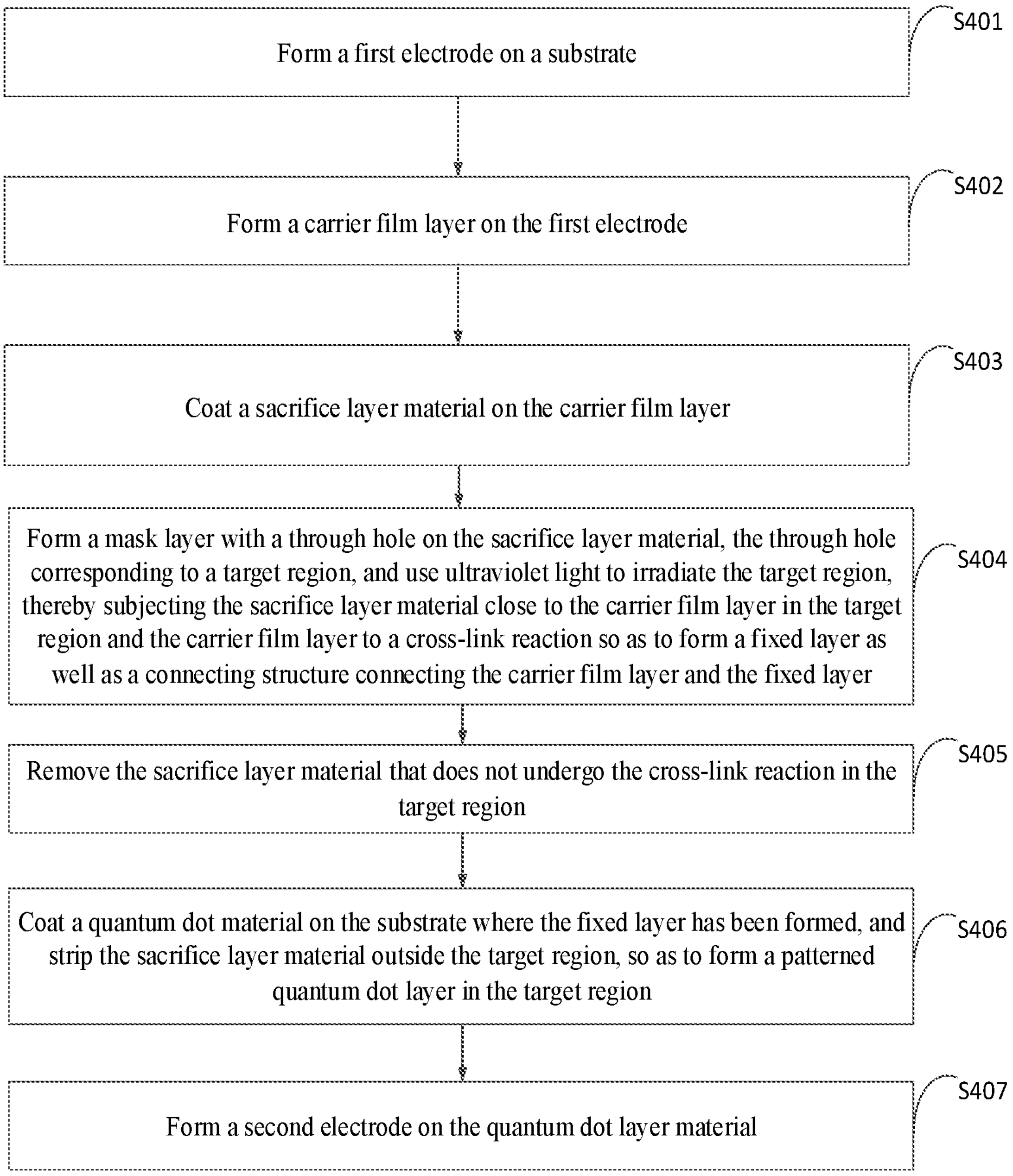
FIG. 4 is a schematic flow diagram of a manufacturing method of a quantum dot light-emitting device according to embodiments of the disclosure.

Based on the same inventive concept, an embodiment of the disclosure further provides a manufacturing method of a quantum dot light-emitting device, as shown in FIG. 4, including:

S401, forming a first electrode on a substrate;

S402, forming a carrier film layer on the first electrode;

S403, coating a sacrifice layer material on the carrier film layer;

S404, forming a mask layer with a through hole on the sacrifice layer material, the through hole corresponding to a target region, and ultraviolet light is used to irradiate the target region, thereby subjecting the sacrifice layer material close to the carrier film layer in the target region and the carrier film layer to a cross-link reaction so as to form a fixed layer as well as a connecting structure connecting the carrier film layer and the fixed layer;

S405, removing the sacrifice layer material that does not undergo the cross-link reaction in the target region;

S406, coating a quantum dot material on the substrate where the fixed layer has been formed, and peeling off the sacrifice layer material outside the target region, so as to form a patterned quantum dot layer in the target region; and

S407, forming a second electrode on the quantum dot layer.

In the manufacturing method of the above quantum dot light-emitting device provided by embodiments of the disclosure, ultraviolet light is used to irradiate a target region where quantum dots need to be deposited, the sacrifice layer material and a carrier film layer material in the target region are cross-linked, and the fixed layer is a film layer formed by subjecting thin film molecules close to the carrier film layer in the sacrifice layer material and the carrier film layer to a cross-link reaction under irradiation of the ultraviolet light, so that the fixed layer and the carrier film layer form chemical bonds and are tightly bonded together. Therefore, in a process of wet-etching the sacrifice layer material, a solvent only dissolves the sacrifice layer material not cross-linked with the carrier film layer in the target region, ultrasonic stripping is performed after the quantum dots are spin-coated, and the fixed layer below the quantum dots will not be ultrasonic-stripped by the solvent because it is cross-linked with the carrier film layer, so that entirety of patterning the quantum dot layer is maintained.

During specific implementation, in the manufacturing method of the above quantum dot light-emitting device provided by embodiments of the disclosure, the sacrifice layer material has a fixed unit and a photosensitive radical connected with the fixed unit, and the carrier film layer has a first radical.

The subjecting the sacrifice layer material close to the carrier film layer in the target region and the carrier film layer to the cross-link reaction so as to form the fixed layer as well as the connecting structure connecting the carrier film layer and the fixed layer is specifically:

the photosensitive radical of the sacrifice layer material close to the carrier film layer in the target region and the first radical of the carrier film layer are subjected to the cross-link reaction to form the connecting structure, and the fixed unit connected with the radical subjected to the cross-link reaction constitutes the fixed layer.

During specific implementation, in the manufacturing method of the above quantum dot light-emitting device provided by embodiments of the disclosure, a structure of the sacrifice layer material may include

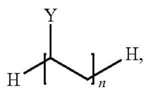

where n>1 and Y is any one of

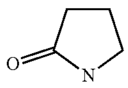 or 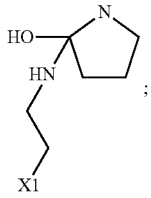;

and the structure of the sacrifice layer material includes at least one

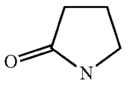 and one 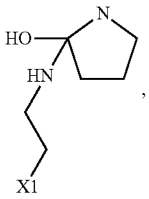, where

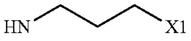

is the photosensitive radical.

In one possible embodiment, the structure of the sacrifice layer material is

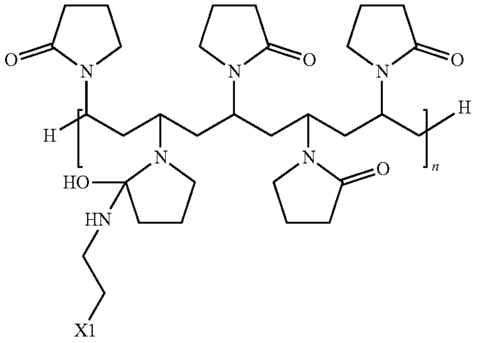

The structure

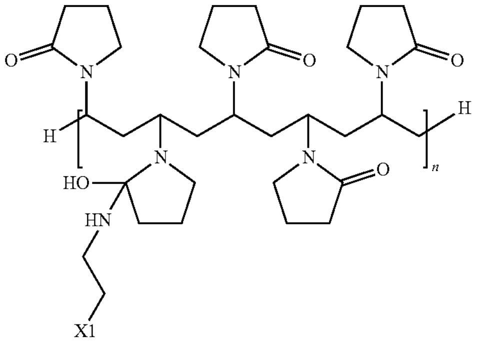

is illustrated by one monomer only including one

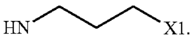.

Because

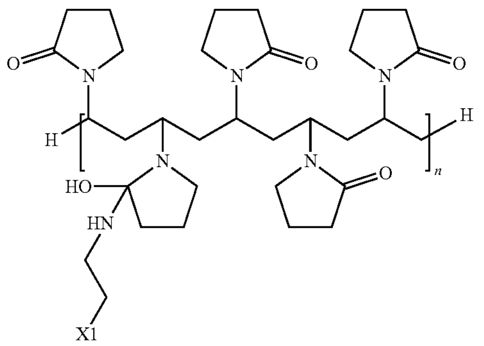

is a polymer, with a relatively large molecular weight, during practical manufacturing,

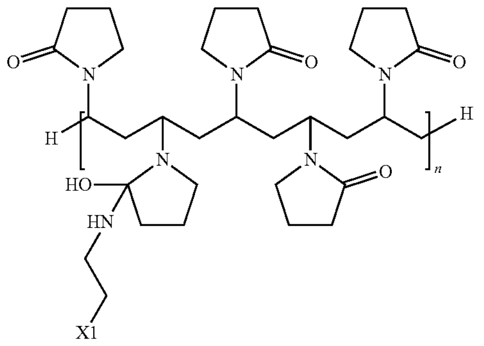

may also include a plurality of

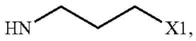, for example,

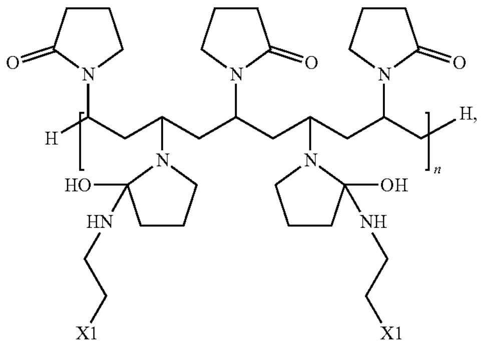

etc.

During specific implementation, in the above quantum dot light-emitting device provided by embodiments of the disclosure, X1 above may be one of the following: an epoxy group, a hydroxyl group, an amino group, an acrylate radical, olefin, a mercapto group, or diene, and the first radical connected with the surface of the carrier film layer may be one of the following: a hydroxyl group, an amino group, an epoxy group, an acrylate radical, a mercapto group, olefin, or diene. The X1 and the first radical are selected based on a situation that the cross-link reaction can be caused under irradiation of the ultraviolet light. Reference may be made to FIG. 3.

The fixed layer in the embodiment of the disclosure is a film layer formed by subjecting the photosensitive radical in the thin film molecules close to the carrier film layer in the sacrifice layer material and the first radical connected with the surface of the carrier film layer to the cross-link reaction under irradiation of the ultraviolet light, and the sacrifice layer material is formed by a copolymerization reaction of

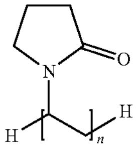

and a photosensitive radical

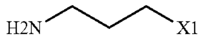

containing a radical that can undergo a photocrosslinking reaction. Considering a solubility of the sacrifice layer material that does not undergo the cross-link reaction in a solvent (in subsequent wet etching), a molar ratio of the photosensitive radical to the sacrifice layer material cannot be larger than 30%. If it is larger than 30%, the sacrifice layer material has a relatively low solubility in the solvent and is not easy to remove. Therefore, in the manufacturing method of the above quantum dot light-emitting device provided by embodiments of the disclosure, the molar ration of

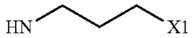

(the photosensitive radical) to

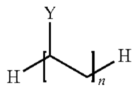

is smaller than or equal to 30%, so that in a subsequent process of stripping the sacrifice layer material that does not undergo the cross-link reaction, the solvent may rapidly dissolve the sacrifice layer material that does not undergo the cross-link reaction.

It should be noted that, the embodiment of the disclosure is described by taking the sacrifice layer material as an alcohol-soluble material as an example. Of course, the sacrifice layer material is not limited to the structure in the embodiment of the disclosure, and may also be of other structures, and all materials soluble in the solvent and has the photosensitive radical belong to contents under protection of the disclosure.

In one possible implementation, in the manufacturing method of the above quantum dot light-emitting device provided by embodiments of the disclosure, the forming the mask layer with the through hole on the sacrifice layer material may specifically include:

forming photoresist on the sacrifice layer material, patterning the photoresist to remove the photoresist in the target region, so as to form the photoresist with a through hole. Since the photoresist only needs to be exposed and developed to form a patterned photoresist, the photoresist may be patterned according to a pattern of a patterned quantum dot layer to be formed, which is simple and convenient to manufacture. Therefore, the embodiment of the disclosure adopts the patterned photoresist as the mask layer.

Of course, the mask layer is not limited to forming by the photoresist. For example, the mask layer may be a mask layer with a through hole region manufactured by a quartz material or a metal material.

Specifically, the embodiment of the disclosure adopts the patterned photoresist as the mask layer. Because the photoresist needs to be exposed and developed to form a patterned region, taking positive photoresist as an example, an exposed region is developed, a non-exposed region is preserved. For preserved photoresist, the exposed photoresist generally needs to be washed off by an acid or an alkali. Corrosiveness of the acid or the alkali will destroy performance of the quantum dots, so it is necessary to introduce the sacrifice layer before the photoresist. The sacrifice layer may be peeled off by using an ordinary solvent through ultrasound, that is, the sacrifice layer is introduced to better strip the photoresist.

In the embodiment of the disclosure, a mask layer including the sacrifice layer material and the photoresist is adopted to manufacture the patterned quantum dot layer in the subsequent manufacturing method.

A preparation method of a quantum dot light-emitting device in the inverted structure provided by embodiments of the disclosure will be briefly described below through specific embodiments. Of course, the embodiment of the disclosure is also applicable to a preparation method of the conventional structure. Specifically, preparation methods of film layers in the quantum dot light-emitting device include but are not limited to one or more of a spin-coating method, an evaporation method, a chemical vapor deposition method, a physical vapor deposition method, a magnetron sputtering method, etc.

Optionally, the quantum dots of the quantum dot layer provided by embodiments of the disclosure include but are not limited to CdS, CdSe, ZnSe, InP, PbS, CsPbCl3, CsPbBr3, CsPhI3, CdS/ZnS, CdSe/ZnSe, CdSe/ZnS, ZnSe, InP/ZnS, PbS/ZnS, CsPbCl3/ZnS, CsPbBr3/ZnS, CsPhI3/ZnS and other quantum dots.

In order to realize full-color display, the quantum dot layer generally includes patterned quantum dots of different colors. In the embodiment of the disclosure, to take the quantum dot layer including a first quantum dot layer, a second quantum dot layer and a third quantum dot layer as an example, a method for patterning a nanoparticle layer provided in the embodiment of the disclosure is described in detail with reference to the accompanying drawings.

A quantum dot solution is prepared. To take the quantum dot being CdSe/ZnS as an example, a first quantum dot solution, a second quantum dot solution and a third quantum dot solution of different colors are prepared respectively. Specifically, the CdSe/ZnS quantum dots may be formed by methods including but not limited to, a solution-phase synthesis method, a hydrothermal method, and a solvothermal method.

Illustration is made below taking the structure of the sacrifice layer material being

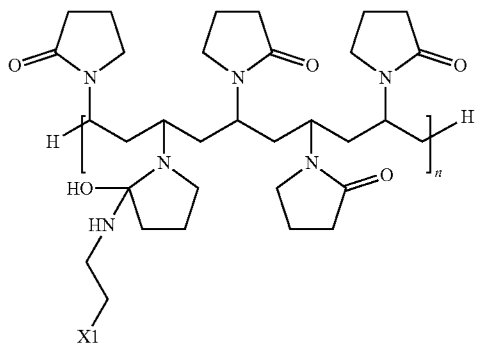

as an example.

The sacrifice layer material is prepared: 1 g of polyvinylpyrrolidone is dissolved in 20 ml of dimethylformamide (DMF) to form a solution, 0.14 g of acetic acid is added to the solution, a carbonyl group in the polymer is protonated (25% molar content), then, 0.22 g of 1-ethylamino propylene oxide is added to the solution, and the solution is heated at 120° C. for 24 hours in circumfluence under a nitrogen atmosphere. After a reaction is completed, the solution is immersed in toluene, a white solid is precipitated, and toluene is used for Soxhlet extraction for 12 hours. After the extraction is completed, the toluene is removed by vacuum heating at 100° C. to obtain 1.18 g of a white solid, which is the sacrifice layer material. A schematic diagram of a chemical reaction principle is shown in FIG. 5.

Figure 6A:
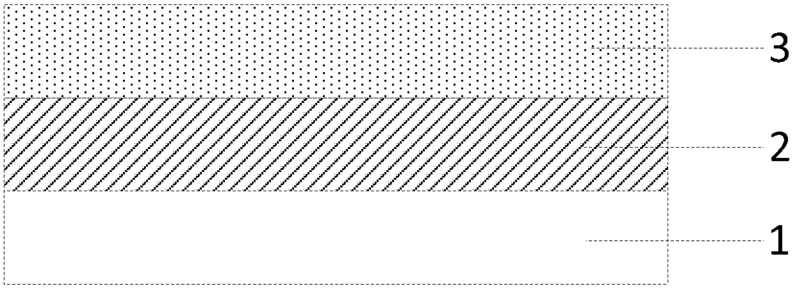
FIG. 6A to FIG. 6I are schematic structural diagrams corresponding to respective preparation steps in a manufacturing method of a quantum dot light-emitting device according to embodiments of the disclosure.

(1) The first electrode 2 (the cathode) is formed on the substrate 1, and a manufacturing method of the cathode is the same as that in the prior art, which is not described in detail here. The substrate 1 may be a glass or flexible PET substrate. A cathode material may be a transparent metal oxide conductive material, such as ITO (indium tin oxide), AZO (aluminum doped zinc oxide), IGZO (indium gallium zinc oxide) etc. The substrate 1 formed with the cathode 2 is sequentially washed with water, ethanol and acetone for 10 minutes, then dried with an air gun, and treated with ultraviolet ozone for 10 minutes. Then, the carrier film layer 3 (the electron transport layer) is formed on the first electrode 2. A material of the electron transport layer may be ZnO. For example, a ZnO nanoparticle ethanol solution is spin-coated on the first electrode 2, a spin-coating speed is 3000 rpm, and annealing is performed at 120° C. for 10 minutes to complete preparation of the electron transport layer, as shown in FIG. 6A. The first radical (a hydroxyl group) is connected with a surface of the electron transport layer.

Figure 6B:
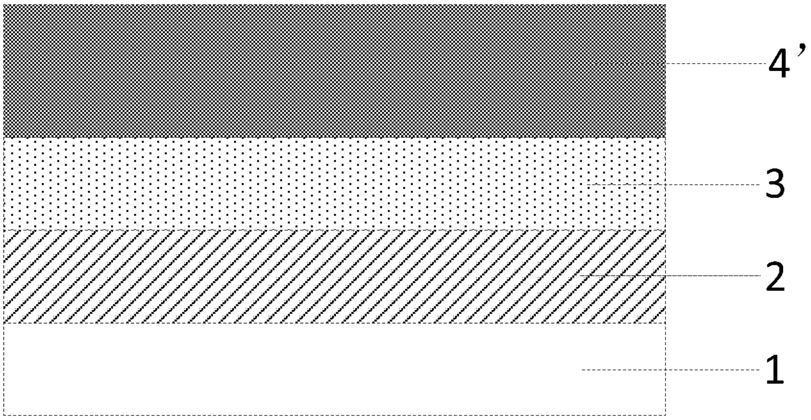

(2) The sacrifice layer material 4' with a photo acid generator is coated on the carrier film layer 3. Hydrogen ions generated by the photo acid generator under irradiation of the ultraviolet light are conducive to causing the cross-link reaction, as shown in FIG. 6B. To take the structure of the sacrifice layer material 4' being

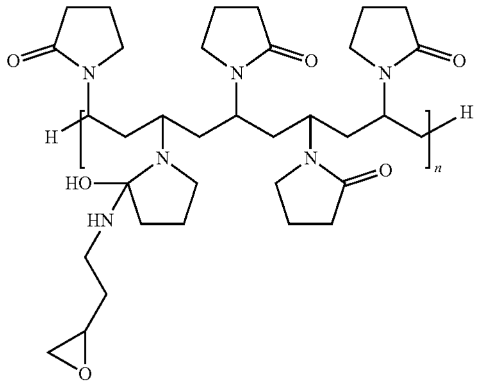

as an example, the structure has the fixed unit

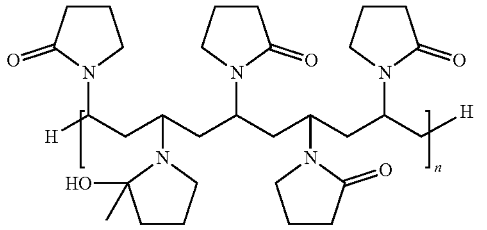

and the photosensitive radical

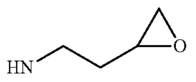

connected with the fixed unit. Specifically, 15 mg/ml of an ethanol solution with the sacrifice layer material

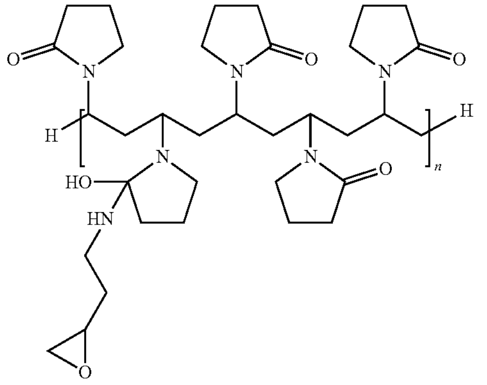

is spin-coated on the carrier film layer 3. The ethanol solution contains 2-chloro-4,6-diphenyl-1,3,5-triazine with a volume content of 1.5% as the photo acid generator, the spinning speed is 2000 rpm, and annealing is performed at 100° C. for 5 minutes. Specifically, selection of the photo acid generator is not limited to 2-chloro-4,6-diphenyl-1,3,5-triazine.

Figure 6C:
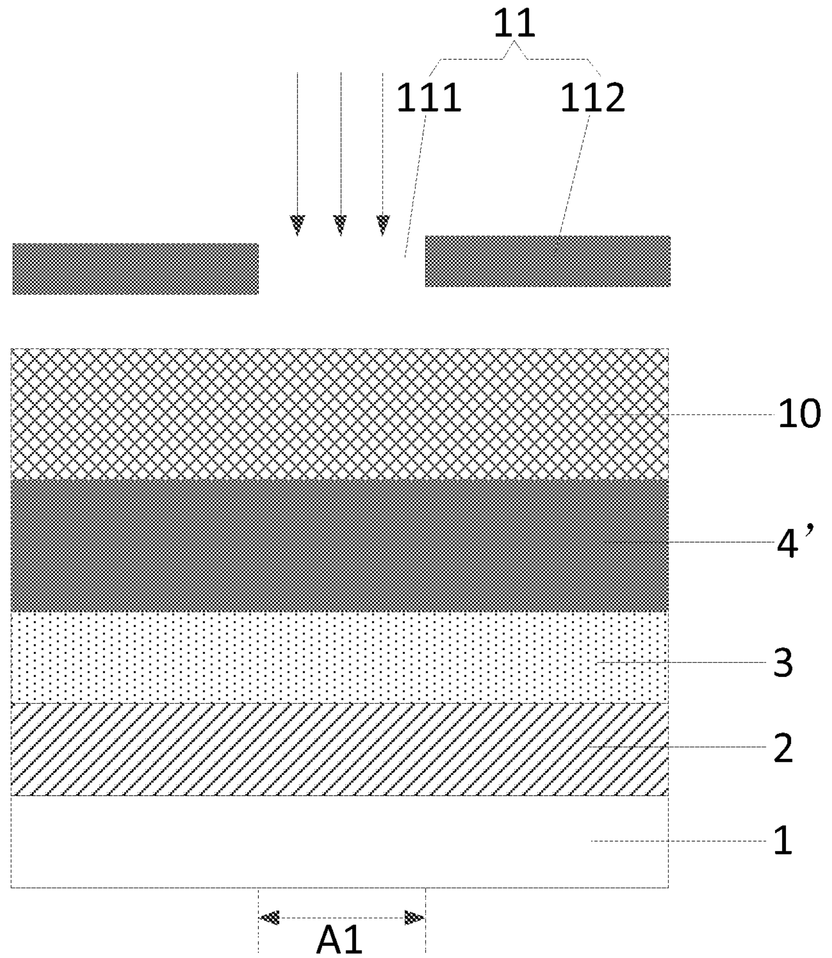

(3) The positive photoresist 10 is spin-coated on the sacrifice layer material 4' at a spinning speed of 4000 rpm, as shown in FIG. 6C. The mask 11 is used to shade the photoresist 10. The mask 11 includes a light transmitting region 111 and a light shading region 112, the light shading region 112 corresponds to a photoresist 10 reserving region, and the light transmitting region 111 corresponds to a first target region A1. The photoresist 10 is patterned (exposure developing), and an exposure amount is 50 mj. After exposure, xylene is used for development. After development is completed, annealing is performed at 130° C. for 90 s to remove the photoresist in the first target region A1, thus forming the photoresist with a through hole, as shown in FIG. 6D.

Figure 6D:
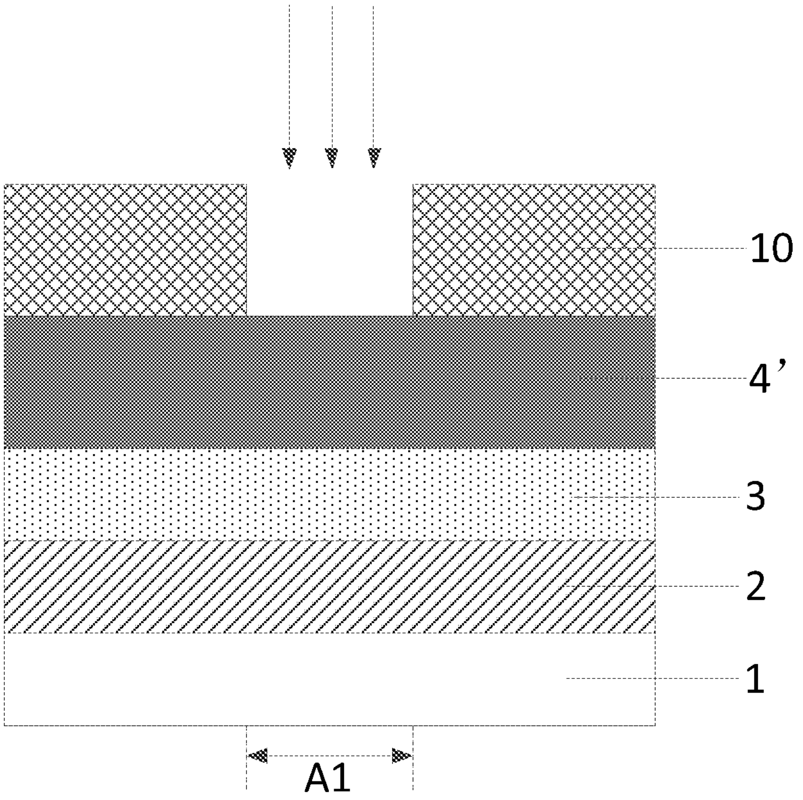

(4) The ultraviolet light (shown by arrow) is used to irradiate the first target region A1 in FIG. 6D, and an exposure amount is 500 mj. The photo acid generator generates the hydrogen ions under irradiation, the epoxy group in the photosensitive radical

Figure 6E:
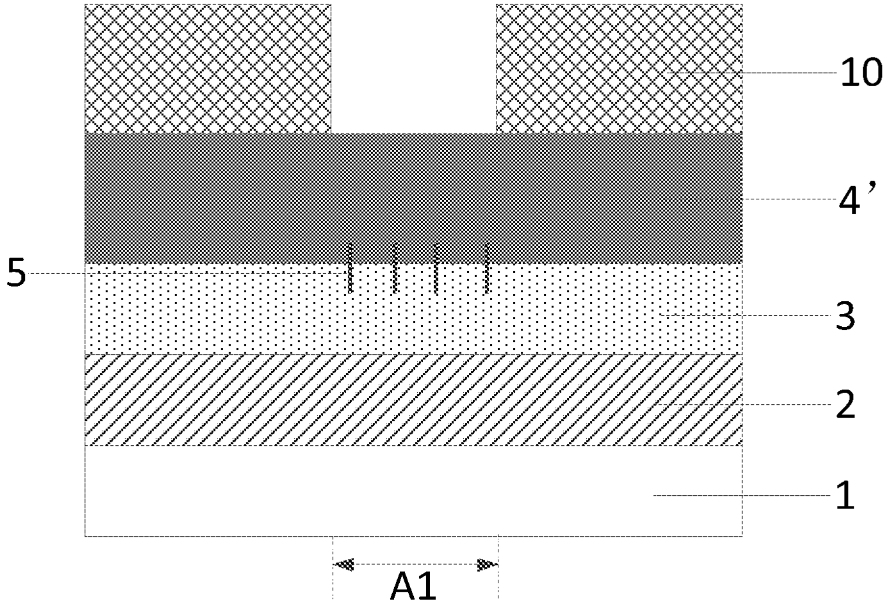

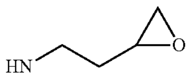

in the sacrifice layer material 4' close to the carrier film layer 3 in the first target region A1 undergoes the cross-link reaction with the first radical (OH) on the surface of the electron transport layer under an action of the hydrogen ions generated by the photo acid generator, and as shown in FIG. 6E, the connecting structure 5 between the carrier film layer 3 and the sacrifice layer material 4' represents that

Figure 7:
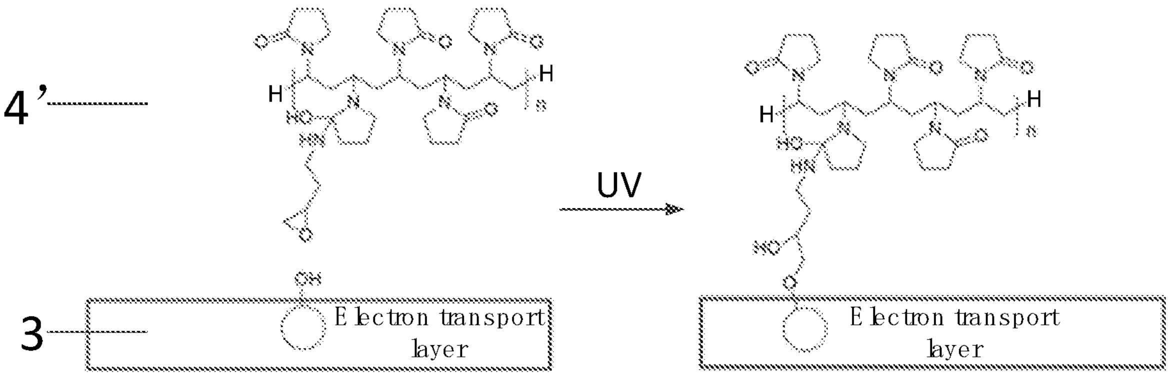
FIG. 7 illustrates a specific schematic principle by which a sacrifice layer material undergoing a cross-link reaction with a carrier film layer according to embodiments of the disclosure.

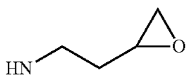

is cross-linked with OH. A specific cross-link reaction principle is shown in FIG. 7. UV represents the ultraviolet light, the OH connected with the carrier film layer 3 (the electron transport layer) undergoes the cross-link reaction with the epoxy group in the sacrifice layer material 4', so that the sacrifice layer material 4' is tightly connected with the carrier film layer 3 (the electron transport layer).

Figure 6F:
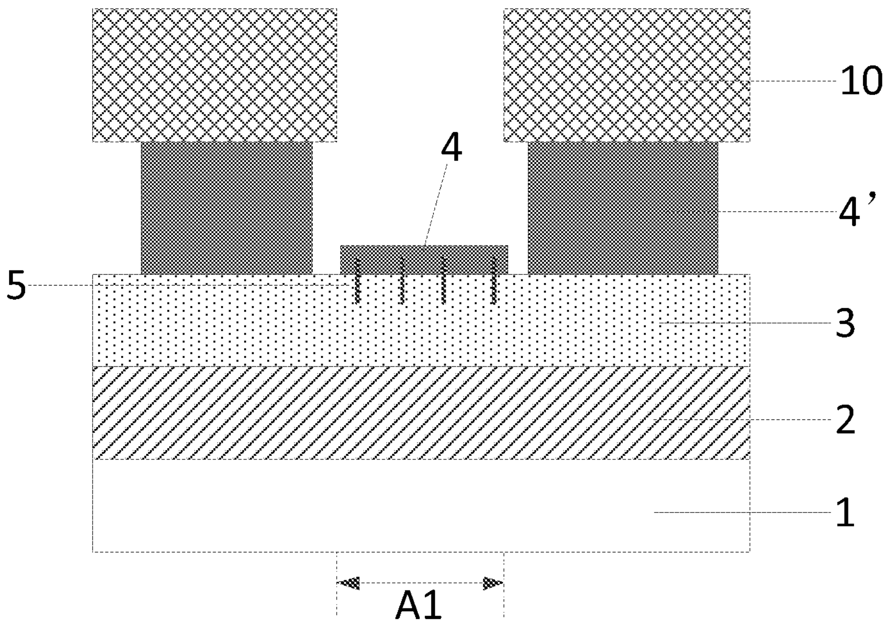
Figure 8:
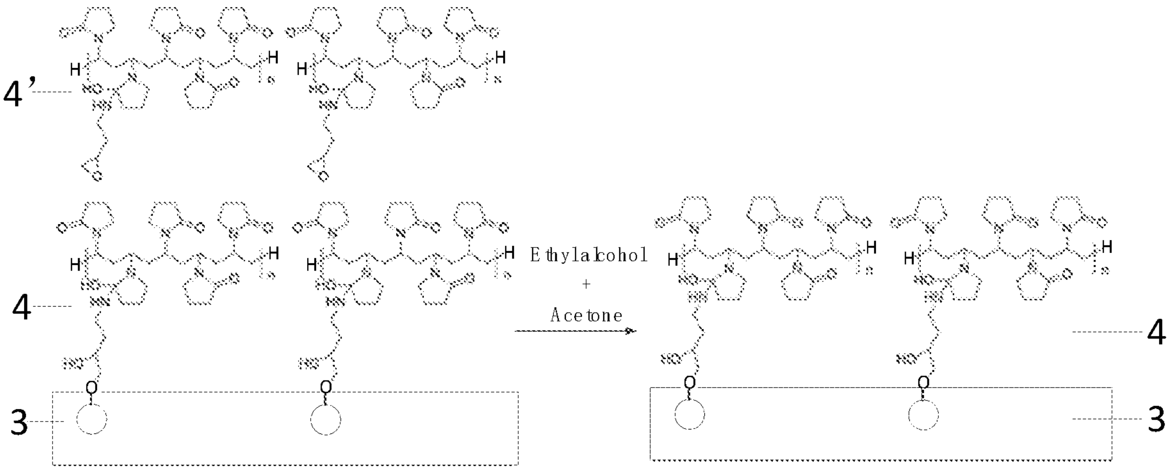
FIG. 8 is a schematic diagram showing removing a sacrifice layer material that does not undergo a cross-link reaction by adopting a solvent according to embodiments of the disclosure.

(5) A mixed solution of ethyl alcohol and acetone with a volume ratio of 1:4 is used for wet-etching on the sacrifice layer material 4' that does not undergo the cross-link reaction in the first target region A1 with an etching duration of 10*s*, the sacrifice layer material 4' that does not undergo the cross-link reaction in the first target region A1 is removed so as to form the fixed layer 4 constituted by the fixed unit in the first target region A1, and the layer is dried after etching is completed, as shown in FIG. 6F. Specifically, a schematic principle diagram of using the mixed solution of the ethyl alcohol and the acetone to wash the sacrifice layer material 4' that does not undergo the cross-link reaction in the first target region A1 is as shown in FIG. 8, the sacrifice layer material 4' that does not undergo the cross-link reaction is etched by the mixed solution of the ethyl alcohol and the acetone with the volume ratio of 1:4, and the sacrifice layer material 4' that undergoes the cross-link reaction is tightly connected with the carrier film layer 3 (the electron transport layer).

Figure 6G:
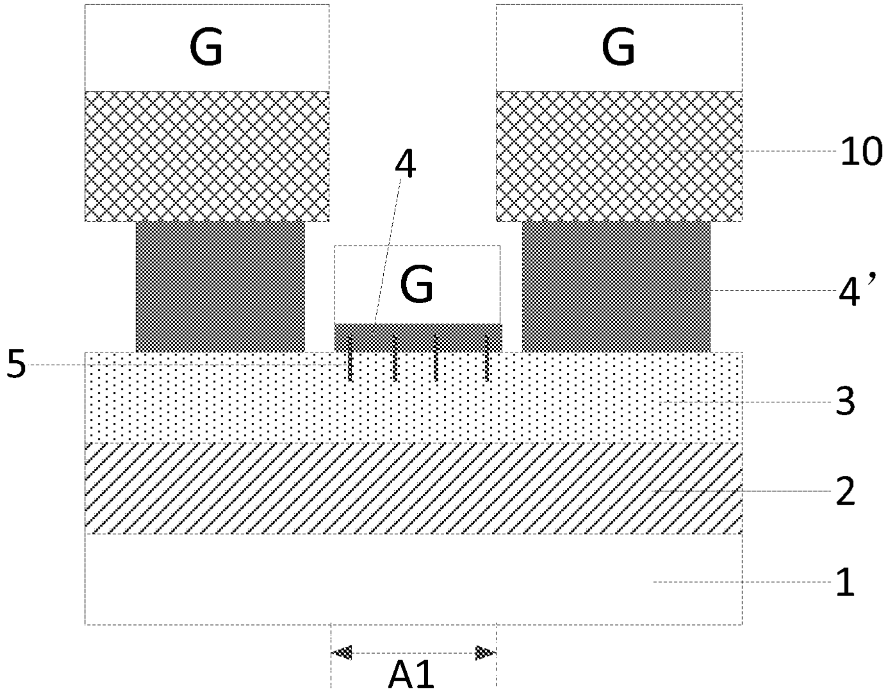
Figure 6H:
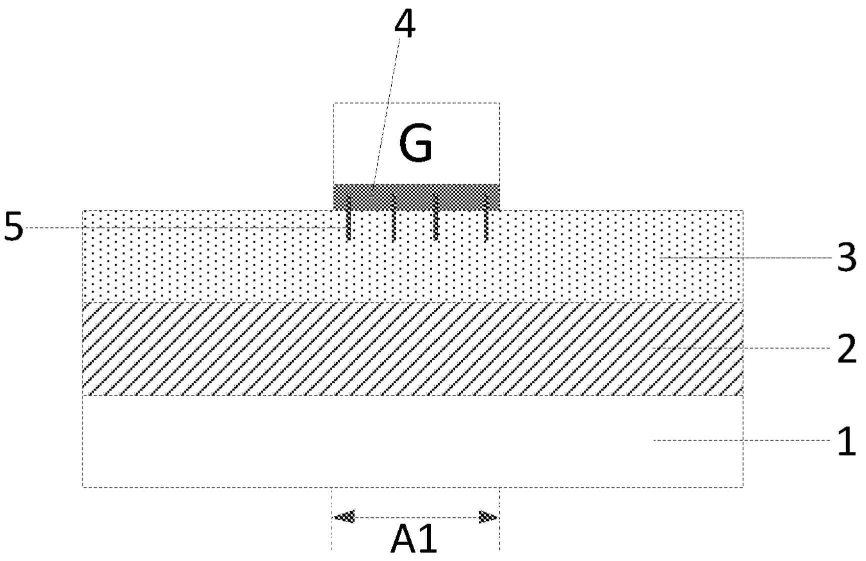

(6) A first quantum dot material G (for example, a CdSe/ZnS green quantum dot octane solution with a concentration of 15 mg/ml, a ligand being octanethiol and a spinning speed being 3000 rpm) is coated (for example, spin-coated) on the substrate formed with the fixed layer 4, as shown in FIG. 6G. The sacrifice layer material 4 outside the first target region A1 is peeled off by soaking in a solvent (for example, ethanol) or rinsing with a solvent (for example, ethanol) to form a patterned first quantum dot layer Gin the first target region A1, as shown in FIG. 6H.

Figure 6I:
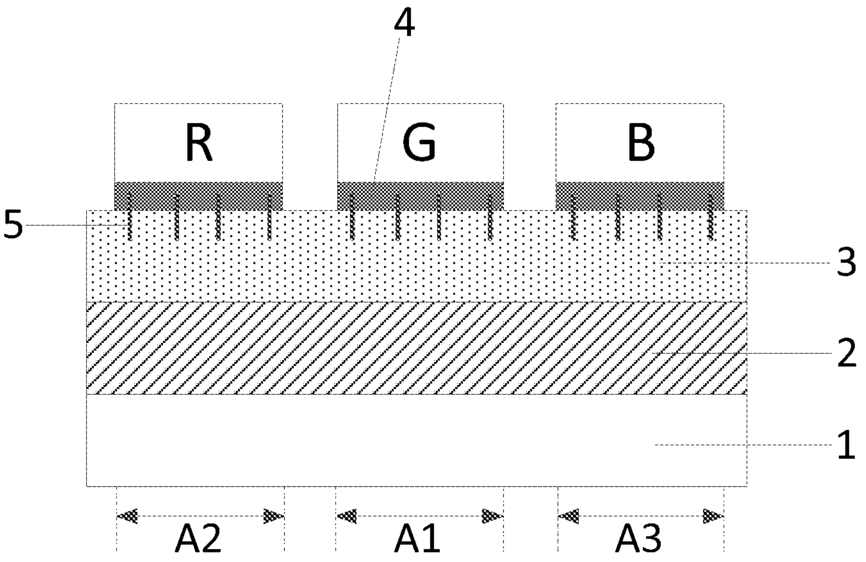

(7) Steps (2)-(6) above are respectively repeated to form a second quantum dot layer R in a second target region A2, and form a third quantum dot layer B in a third target region A3, as shown in FIG. 6I, and a difference in forming the quantum dot layers of three colors lies in a difference in quantum dot materials coated.

(8) The hole transport layer 8 is formed on the quantum dot layers (R, G, and B), the hole injection layer 9 is formed on the hole transport layer 8, and the second electrode 7 (the anode) is formed on the hole injection layer 9, as shown in FIG. 1. For example, a thickness of the hole transport layer 8 is about 50 nm, a thickness of the hole injection layer 9 is about 10 nm and a thickness of the second electrode 7 is about 150 nm.

Packaging is performed after preparation of the above film layers is completed, and preparation of the quantum dot light-emitting device of the inverted structure in the embodiment of the disclosure is completed.

It should be noted that, the above description is made by taking the sacrifice layer material being

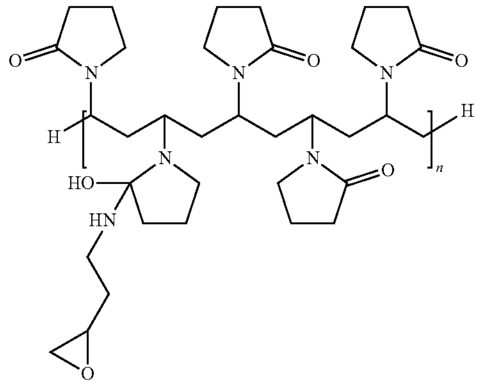

as an example. For example, when the sacrifice layer material is

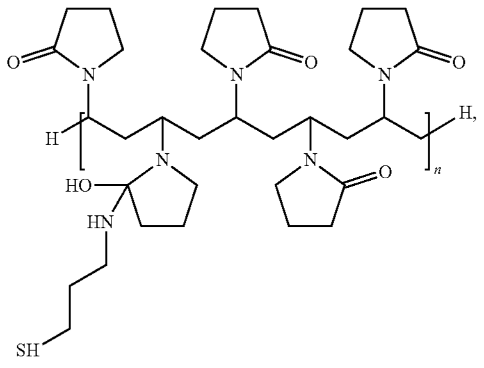

a method of preparing the method is: 1 g of polyvinylpyrrolidone is dissolved in 20 ml of dimethylformamide (DMF) to form a solution, 0.14 g of acetic acid is added to the solution, a carbonyl group in the polymer is protonated (25% molar content), then 0.24 g of 1-mercaptopropylamine is added to the solution, and the solution is heated at 120° C. for 24 hours in circumfluence under a nitrogen atmosphere. After a reaction is completed, the solution is immersed in toluene, a white solid is precipitated, and toluene is used for Soxhlet extraction for 12 hours. After the extraction is completed, the toluene is removed by vacuum heating at 100° C. to obtain 1.12 g of a white solid, and the sacrifice layer material

Figure 9:
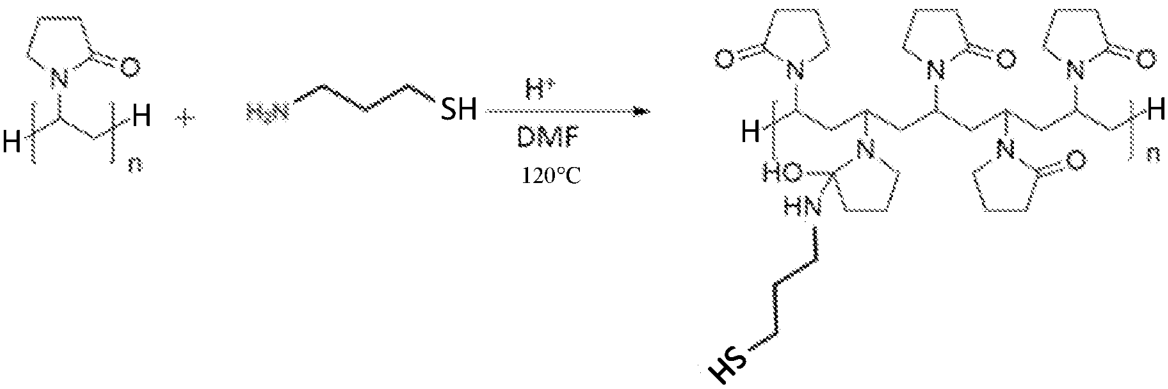
FIG. 9 illustrates another schematic principle by which preparing material of a sacrifice layer according to embodiments of the disclosure.

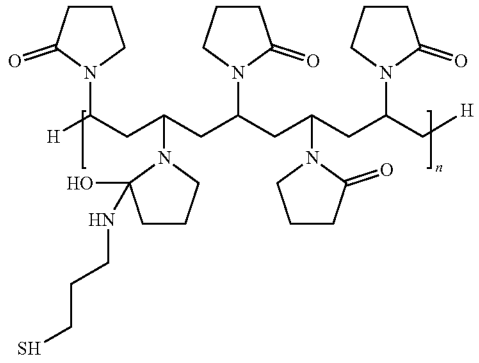

is prepared. A schematic diagram of a chemical reaction principle is shown in FIG. 9.

When the sacrifice layer material of

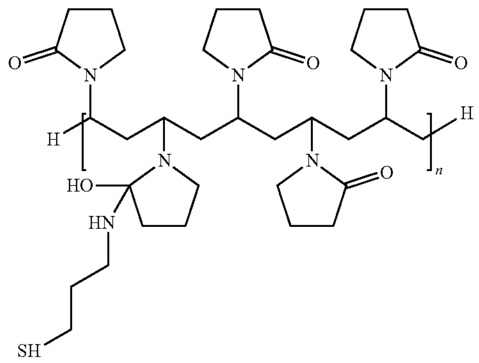

is used to form the quantum dots, because a mercapto group (SH) cannot undergo the cross-link reaction with a hydroxyl group, before the sacrifice layer material

Figure 10:
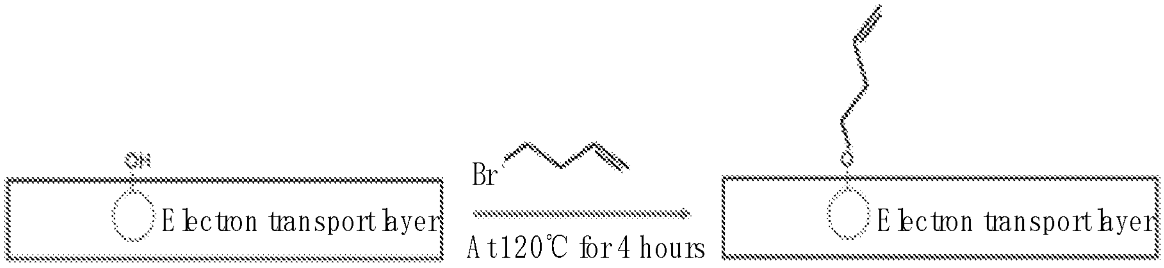
FIG. 10 illustrates a schematic principle by which modifying a hydroxyl group connected with a surface of a carrier film layer according to embodiments of the disclosure.

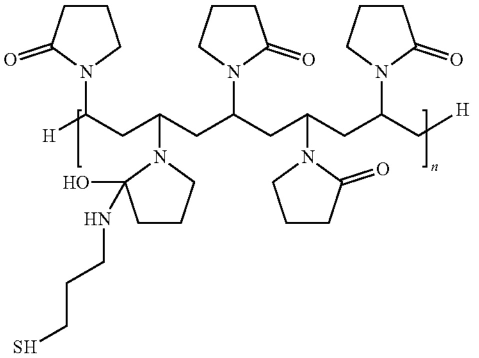

is coated in step (2) above, the first radical (hydroxyl group) connected with the electron transport layer material in step (1) needs to be modified, for example, modified to be olefin. A specific modification process is: after preparation of the electron transport layer in step (1) is completed, 0.1 g of sodium hydride is dissolved in 10 ml of ethyl alcohol to form a solution, 2 ml of the solution is dropped on the electron transport layer, and the solution is removed by spin coating after standing for 1 minute; meanwhile 0.135 g 1-bromopropene is dissolved in 2 ml of dimethylformamide and added dropwise to a zinc oxide film layer, which is heated to 120° C. for 4 hours in a nitrogen environment to complete modification of the hydroxyl group on a surface of zinc oxide, as shown in FIG. 10.

After the sacrifice layer material

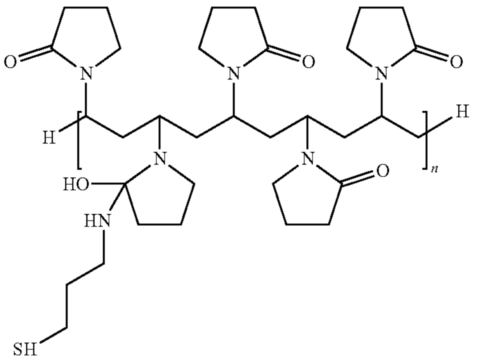

is coated on the carrier film layer 3, the ultraviolet light (shown by arrow) is used to irradiate the first target region A1 in FIG. 6D, and an exposure amount is 500 mj. The photo acid generator generates the hydrogen ions under irradiation, the mercapto group in the photosensitive radical

Figure 11:
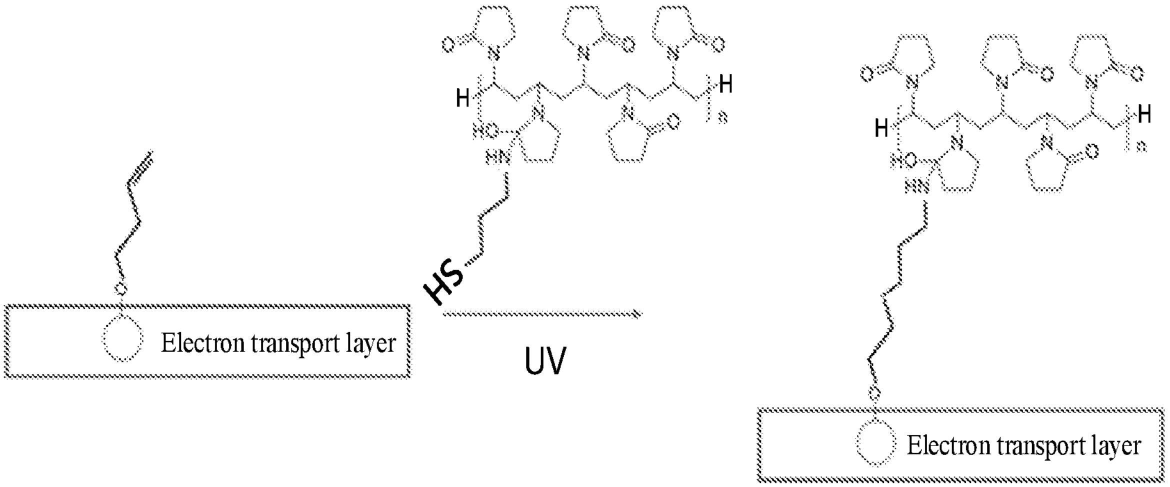
FIG. 11 illustrates another specific schematic principle by which a sacrifice layer material undergoing a cross-link reaction with a carrier film layer according to embodiments of the disclosure.

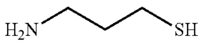

in the sacrifice layer material 4' close to the carrier film layer 3 in the first target region A1 undergoes the cross-link reaction with the first radical (OH) on the surface of the electron transport layer under an action of the hydrogen ions generated by the photo acid generator. A specific cross-link reaction principle is shown as FIG. 11. Therefore, the sacrifice layer material 4' is tightly connected with the carrier film layer 3 (the electron transport layer).

It should be noted that, if the adopted sacrifice layer material can directly undergo the cross-link reaction with the hydroxyl group on the surface of the electron transport layer, the structure shown in FIG. 1 in the embodiment of the disclosure may be formed by adopting steps (1) to (8) above; and if the adopted sacrifice layer material cannot directly undergo the cross-link reaction with the hydroxyl group on the surface of the electron transport layer, the hydroxyl group connected with the electron transport layer needs to be modified so that the hydroxyl group is modified to a structure that can undergo the cross-link reaction with the sacrifice layer material, for example, the aforesaid embodiment described in examples.

The disclosure does not limit a light-emitting type of the quantum dot light-emitting device, which is, for example, not limited to bottom light-emitting or top light-emitting.

During specific implementation, the quantum dot light-emitting device provided by embodiments of the disclosure also includes other functional film layers well known to those of skill in the art, which will not be described in detail here.

It should be noted that, the embodiment of the disclosure mainly takes the light-emitting device of the inverted structure as an example to describe the quantum dot light-emitting device and its manufacturing method in detail. Of course, the embodiment of the disclosure is also applicable to a quantum dot light-emitting device in the conventional structure and its manufacturing method.

During specific implementation, a color of light emitted by the first quantum dot layer, color of light emitted by the second quantum dot layer, and color of light emitted by the third quantum dot layer in the embodiment of the disclosure are respectively green, red, and blue, so that the embodiment of the disclosure completes a patterning process of full-color quantum dots through the above patterning method. When a technology of the sacrifice layer material plus the photoresist is adopted to perform quantum dot patterning, the ultraviolet light is used to irradiate the target region where the quantum dots need to be deposited, the sacrifice layer material and the carrier film layer material in the target region are cross-linked, and the fixed layer is the film layer formed by subjecting the photosensitive radical in the thin film molecules close to the carrier film layer in the sacrifice layer material and the first radical connected with the surface of the carrier film layer to the cross-link reaction under irradiation of the ultraviolet light, so that the fixed layer and the carrier film layer form the chemical bonds and are tightly bonded together. Therefore, in a process of wet-etching the sacrifice layer material, the solvent only dissolves the sacrifice layer material not cross-linked with the carrier film layer in the target region, ultrasonic stripping is performed after the quantum dots are spin-coated, and the fixed layer below the quantum dots will not be ultrasonic-peeled off by the solvent because it is cross-linked with the carrier film layer, so that entirety of patterning the quantum dot layer is maintained.

It should be noted that the embodiment of the disclosure includes but is not limited to the alcohol-soluble sacrifice layer material disclosed above, and may also include other materials, as long as they have a photosensitive radical and can be dissolved in a solvent.

In the above quantum dot light-emitting device and the manufacturing method thereof provided by the embodiments of the disclosure, the fixed layer is arranged between the carrier film layer and the quantum dot layer, and the connecting structure is arranged between the fixed layer and the carrier film layer, that is, the fixed layer is fixed on the carrier film layer. In this way, when the technology of the sacrifice layer material plus the photoresist is adopted to perform quantum dot patterning, the ultraviolet light is used to irradiate the target region where the quantum dots need to be deposited, the sacrifice layer material and the carrier film layer material in the target region are cross-linked, and the fixed layer is the film layer formed by subjecting the thin film molecules close to the carrier film layer in the sacrifice layer material and the carrier film layer to the cross-link reaction, so that the fixed layer and the carrier film layer form the chemical bonds and are tightly bonded together. Therefore, in the process of wet-etching the sacrifice layer material, the solvent only dissolves the sacrifice layer material not cross-linked with the carrier film layer in the target region, ultrasonic stripping is performed after the quantum dots are spin-coated, and the fixed layer below the quantum dots will not be ultrasonic-stripped by the solvent because it is cross-linked with the carrier film layer, so that entirety of patterning the quantum dot layer is maintained.

While preferred embodiments of the disclosure have been described, additional changes and modifications to these embodiments may be made by those of skill in the art once they are aware of basic inventive concepts. Therefore, the appended claims are intended to be construed to include the preferred embodiments and all changes and modifications that fall within the scope of the disclosure.

Obviously, those of skill in the art can make various changes and modifications to the embodiments of the disclosure without departing from the spirit and scope of the embodiments of the disclosure. Thus, provided that these changes and modifications of the embodiments of the disclosure fall within the scope of the claims of the disclosure and their equivalents, the disclosure is also intended to cover such changes and modifications.

What is claimed is:

1. A quantum dot light-emitting device, comprising:

a substrate;

a first electrode, disposed on the substrate;

a carrier film layer, disposed on a side of the first electrode facing away from the substrate;

a fixed layer, disposed on a side of the carrier film layer facing away from the substrate, wherein a connecting structure is provided between the fixed layer and the carrier film layer;

a quantum dot layer, disposed on a side of the fixed layer facing away from the substrate; and a second electrode, disposed on a side of the quantum dot layer facing away from the substrate;

wherein the fixed layer and the carrier film layer are connected via the connecting structure, and the connecting structure is formed by subjecting a first radical of the carrier film layer and a photosensitive radical connected with the fixed layer to a cross-link reaction under irradiation of ultraviolet light.

2. The quantum dot light-emitting device according to claim 1, wherein the connecting structure is one of following:

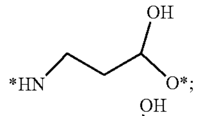

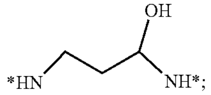

-continued

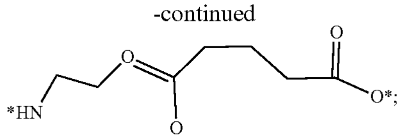

or

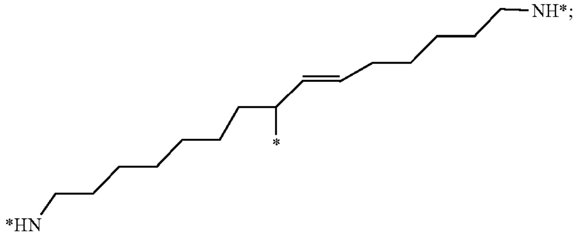

wherein a position indicated by * in NH* represents a position for connecting with the fixed layer, and a position indicated by other * represents a position for connecting with the carrier film layer.

3. The quantum dot light-emitting device according to claim 1, wherein an orthographic projection of the fixed layer on the substrate completely overlaps with an orthographic projection of the quantum dot layer on the substrate.

4. The quantum dot light-emitting device according to claim 1, wherein an overall molecular structure of the fixed layer and the photosensitive radical comprises

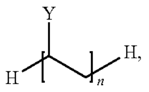

wherein n>1 and Y is any one of

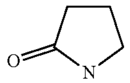

or

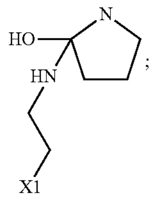

;

and the overall molecular structure of the fixed layer and the photosensitive radical at least comprises

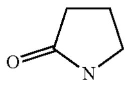

and a

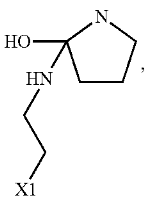

, wherin

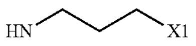

is the photosensitive radical.

5. The quantum dot light-emitting device according to claim 4, wherein X1 is one of following:

an epoxy group, a hydroxyl group, an amino group, an acrylate radical, olefin, a mercapto group, or diene, and the first radical is one of the following: a hydroxyl group, an amino group, an epoxy group, an acrylate radical, a mercapto group, olefin, or diene.

6. The quantum dot light-emitting device according to claim 4, wherein a molar ratio of

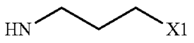

to

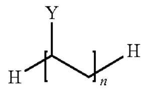

of is smaller than or equal to 30%.

7. The quantum dot light-emitting device according to claim 1, wherein a thickness of the fixed layer is smaller than or equal to 2 nm.

8. The quantum dot light-emitting device according to claim 1, wherein the carrier film layer is an electron transport layer, and the quantum dot light-emitting device further comprises:

a hole transport layer disposed between the second electrode and the quantum dot layer; and a hole injection layer disposed between the hole transport layer and the second electrode.

9. A manufacturing method of the quantum dot light-emitting device according to claim 1, comprising:

forming the first electrode on the substrate;

forming the carrier film layer on the first electrode;

coating a sacrifice layer material on the carrier film layer;

forming a mask layer with a through hole on the sacrifice layer material, the through hole corresponding to a target region, and using ultraviolet light to irradiate the target region to subject the sacrifice layer material close to the carrier film layer in the target region and the carrier film layer to a cross-link reaction so as to form the fixed layer as well as the connecting structure connecting the carrier film layer and the fixed layer;

removing the sacrifice layer material that does not undergo the cross-link reaction in the target region;

coating a quantum dot material on the substrate wherein the fixed layer has been formed, and peeling off the sacrifice layer material outside the target region, so as to form a patterned quantum dot layer in the target region; and forming the second electrode on the quantum dot layer material.

10. The manufacturing method of the quantum dot light-emitting device according to claim 9, wherein the sacrifice layer material has a fixed unit and a photosensitive radical connected with the fixed unit, and the carrier film layer has a first radical; and the subjecting the sacrifice layer material close to the carrier film layer in the target region and the carrier film layer to the cross-link reaction so as to form the fixed layer as well as the connecting structure connecting the carrier film layer and the fixed layer comprises:

subjecting the photosensitive radical of the sacrifice layer material close to the carrier film layer in the target region and the first radical of the carrier film layer to the cross-link reaction to form the connecting structure, wherein the fixed unit connected with the radical subjected to the cross-link reaction constitutes the fixed layer.

11. The manufacturing method of the quantum dot light-emitting device according to claim 10, wherein a structure of the sacrifice layer material comprises

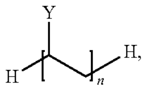

wherein n>1 and Y is any one of or

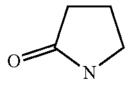

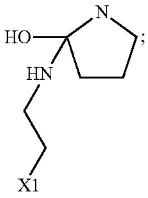

; and the structure of the sacrifice layer material at least comprises a

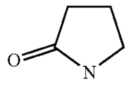

and a

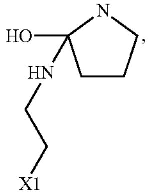

, wherein

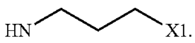

is the photosensitive radical.

12. The manufacturing method of the quantum dot light-emitting device according to claim 11, wherein X1 is one of following: an epoxy group, a hydroxyl group, an amino group, an acrylate radical, olefin, a mercapto group, or diene, and the first radical is one of the following: a hydroxyl group, an amino group, an epoxy group, an acrylate radical, a mercapto group, olefin, or diene.

13. The manufacturing method of the quantum dot light-emitting device according to claim 11, wherein a molar ratio of

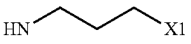
to
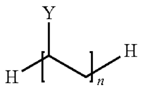

is smaller than or equal to 30%.

14. The manufacturing method of the quantum dot light-emitting device according to claim 10, wherein the coating the sacrifice layer material on the carrier film layer comprises: coating the sacrifice layer material with a photo acid generator on the carrier film layer; and the subjecting the photosensitive radical of the sacrifice layer material close to the carrier film layer in the target region and the first radical of the carrier film layer to the cross-link reaction to form the connecting structure comprises:

subjecting the photosensitive radical of the sacrifice layer material close to the carrier film layer in the target region and the first radical of the carrier film layer to the cross-link reaction under an action of hydrogen ions generated by the photo acid generator to form the connecting structure.

15. The manufacturing method of the quantum dot light-emitting device according to claim 9, wherein the forming the carrier film layer on the first electrode comprises: forming an electron transport layer on the first electrode; and after forming the quantum dot layer, and before forming the second electrode, the method further comprises:

forming a hole transport layer on the quantum dot layer; and forming a hole injection layer on the hole transport layer.

16. The manufacturing method of the quantum dot light-emitting device according to claim 9, wherein the forming the mask layer with the through hole on the sacrifice layer material comprises:

forming photoresist on the sacrifice layer material;

patterning the photoresist, and removing the photoresist in the target region, so as to form the mask layer with the through hole.

17. The manufacturing method of the quantum dot light-emitting device according to claim 16, wherein patterning the photoresist and removing the photoresist in the target region comprises:

shading the photoresist by a mask, wherein the mask comprises a light transmitting region and a light shading region, the light shading region corresponds to a photoresist reserving region, and the light transmitting region corresponds to the target region; and removing the photoresist in the target region using a solvent.

* * * * *